(12) United States Patent
Murata

(10) Patent No.: US 8,456,944 B2
(45) Date of Patent: Jun. 4, 2013

(54) DECODER CIRCUIT OF SEMICONDUCTOR STORAGE DEVICE

(75) Inventor: Nobukazu Murata, Tokyo (JP)

(73) Assignee: Lapis Semiconductor Co., Ltd. (JP)

( * ) Notice: Subject to any disclaimer, the term of this patent is extended or adjusted under 35 U.S.C. 154(b) by 117 days.

(21) Appl. No.: 12/929,864

(22) Filed: Feb. 22, 2011

(65) Prior Publication Data

US 2011/0205815 A1 Aug. 25, 2011

(30) Foreign Application Priority Data

Feb. 24, 2010 (JP) ................................. 2010-039209

(51) Int. Cl.
*G11C 7/00* (2006.01)

(52) U.S. Cl.
USPC ................................ 365/230.03; 365/189.11

(58) Field of Classification Search
USPC ........................ 365/189.11, 230.06
See application file for complete search history.

(56) References Cited

U.S. PATENT DOCUMENTS 5,825,205 A * 10/1998 Ohtsuka .......................... 326/81
2006/0262605 A1* 11/2006 Seki et al. ................. 365/185.29

FOREIGN PATENT DOCUMENTS

| JP | 11-185489 A | 7/1999 |
| JP | 2007-310936 A | 11/2007 |

* cited by examiner

*Primary Examiner* — Hoai V Ho
(74) *Attorney, Agent, or Firm* — Rabin & Berdo, P.C.

(57) ABSTRACT

The present invention provides a row decoder of a semiconductor storage device that prevents an increase in a circuit area while maintaining a high operation speed. Namely, the row decoder of the semiconductor storage device includes a word line selection circuit that has voltage application MOS transistors for each of plural word lines, the voltage application MOS transistors applying a normal voltage to the word lines corresponding to memory cells selected among plural memory cells positioned at a portion where the plural word lines intersect plural bit lines in a predetermined normal operation, and applying a high voltage in a predetermined high voltage operation; and a level shift circuit that outputs the normal voltage or a ground voltage lower than the normal voltage in the normal operation, and that outputs the normal voltage or the high voltage in the high voltage operation, to the voltage application MOS transistor.

4 Claims, 17 Drawing Sheets

FIG.3

| SIGNAL NAME | NORMAL | | HV | |
|---|---|---|---|---|
| | SELECTION | NON-SELECTION | SELECTION | NON-SELECTION |
| HVXB | VCC | | 0.0V | |
| HVXD | 0.0V | | VPP | |
| VWLX | VCC | | VPP | |
| VWLXD | 0.0V | | VCC | |
| VWLXP | 0.0V | | VCC | |
| VNN | 0.0V | | 0.0V | |
| SLCT | VCC | 0.0V | VCC | 0.0V |
| LV_SLCT | VCC | 0.0V | VCC | VCC |
| HV_SLCTB | 0.0V | VCC | VCC | VPP |
| HVXPB* | 0.0V | VCC | VCC | VPP |
| XPB* | 0.0V | VCC | 0.0V | VCC |
| WL* | VCC | 0.0V | VPP | 0.0V |

FIG.6

| SIGNAL NAME | NORMAL | | HV | |
| --- | --- | --- | --- | --- |
| | SELECTION | NON-SELECTION | SELECTION | NON-SELECTION |
| HVX | 0.0V | | VCC | |
| HVXB | VCC | | 0.0V | |
| HVXD | 0.0V | | VPP | |
| VCWX | VCW | | VCC | |
| VWLX | VCW | | VPP | |
| VWLXD | 0.0V | | VCC | |
| VWLXP | 0.0V | | VCC | |
| VNN | 0.0V | | 0.0V | |
| SLCT | VCC | 0.0V | VCC | 0.0V |
| LV_SLCT | VCW | 0.0V | VCC | VCC |
| HV_SLCTB | 0.0V | VCW | VCC | VPP |
| HVXPB* | 0.0V | VCW | VCC | VPP |
| XPB* | 0.0V | VCC | 0.0V | VCC |
| WL* | VCW | 0.0V | VPP | 0.0V |

FIG.11

| SIGNAL NAME | NORMAL | | HV | |
|---|---|---|---|---|
| | SELECTION | NON-SELECTION | SELECTION | NON-SELECTION |
| HVX | 0.0V | | VCC | |
| HVXB | VCC | | 0.0V | |
| HVXD | 0.0V | | VPP | |
| VCWX | VCW | | VCC | |
| VWLX | VCW | | VPP | |
| VWLXD | 0.0V | | VCC | |
| VWLXP | 0.0V | | VCC | |
| VNN | 0.0V | | 0.0V | |
| SLCT | VCC | 0.0V | VCC | 0.0V |
| LV_SLCT | VCW | 0.0V | VCC | VCC |
| HV_SLCTB | 0.0V | VCW | VCC | VPP |
| HVXP * | VCW | 0.0V | VPP | VCC |
| XPB* | 0.0V | VCC | 0.0V | VCC |
| WL* | VCW | 0.0V | VPP | 0.0V |

FIG.14
RELATED ART

| SIGNAL NAME | NORMAL | | HV | |
| --- | --- | --- | --- | --- |
| | SELECTION | NON-SELECTION | SELECTION | NON-SELECTION |
| VWLX | VCW | | VPP | |
| VNN | 0.0V | | 0.0V | |
| SLCT | VCC | 0.0V | VCC | 0.0V |
| HV_SLCTB | 0.0V | VCW | 0.0V | VPP |
| HVXPB* | 0.0V | VCW | 0.0V | VPP |
| XPB* | 0.0V | VCC | 0.0V | VCC |
| WL* | VCW | 0.0V | VPP | 0.0V |

DECODER CIRCUIT OF SEMICONDUCTOR STORAGE DEVICE

CROSS-REFERENCE TO RELATED APPLICATION

This application claims priority under 35 USC 119 from Japanese Patent Application No. 2010-039209, filed on Feb. 24, 2010, the disclosure of which is incorporated by reference herein.

BACKGROUND OF THE INVENTION

1. Field of the invention

The present invention relates to a decoder circuit of a semiconductor storage device. In particular, the present invention relates to a decoder circuit of an electrically rewritable non-volatile semiconductor storage device.

2. Description of the Related Art

In a conventional non-volatile semiconductor storage device, such as a flash memory, a high-voltage transistor is incorporated therein, since the conventional non-volatile semiconductor storage device has to be applied with a high voltage when performing writing or erasing of data. However, it is necessary to increase the thickness of a gate oxide film and the length of a gate of the transistor to withstand a high voltage, which may deteriorate a driving force of the transistor.

Japanese Patent Application Laid-Open (JP-A) No. 11-185489 discloses an X-decoder circuit that selects a word line by switching between a high-voltage driver circuit and a low-voltage driver circuit. This X-decoder circuit uses the high-voltage driver circuit when a high voltage is necessary, such as when writing or erasing data, and uses the low-voltage driver circuit when a high voltage is not necessary, such as when reading data. Due thereto, this X-decoder circuit prevents an operation speed from being lowered when a high voltage is not necessary.

However, this X-decoder circuit has to include not only the high-voltage driver circuit but also the low-voltage driver circuit, which may increases the circuit area of the X-decoder circuit.

JP-A No. 2007-310936 discloses a row decoder including a driver circuit in which a high-voltage transistor is used.

However, this row decoder also uses the high-voltage transistor. Therefore, this row decoder may not perform an operation at high speed and the circuit area of the driver circuit may increase.

FIG. 13 is a diagram illustrating an example of a conventional row decoder 100. A row decoder 100 shown in FIG. 13 selects a word line with reference to the address of a memory cell to be accessed, when accessing to the memory cell. The row decoder 100 applies a normal voltage to the selected word line when reading data, and applies a high voltage to the selected word line when writing or erasing data.

As shown in FIG. 13, the row decoder 100 includes a level shift circuit 102 and a word line selection circuit 104. The level shift circuit 102 includes high-voltage PMOS transistors P101 and P102, NMOS transistors N101 to N104, and an inverter 106. The word line selection circuit 104 includes a high-voltage PMOS transistor P103, high-voltage PMOS transistors P200 to P20$n$ disposed for each signal HVXPB [n:0] respectively, and NMOS transistors N300 to N30$n$, N400 to N40$n$, and N500 to N50$n$ disposed for each signal XPB [n:0] respectively.

FIG. 14 is a chart illustrating the voltage values of the respective signals in a normal operation (NORMAL) that uses a normal voltage when reading data, and in a high voltage operation (HV) that uses a high voltage when writing or erasing data, in selection and non-selection of the word lines. FIG. 15A is a diagram illustrating a timing chart of the respective signals in the normal operation. FIG. 15B is a diagram illustrating a timing chart of the respective signals in the high voltage operation.

VPP shown in FIG. 14 is a high voltage supplied from an external power supply (not shown). An example of VPP is 10.0 [V]. VCC is a voltage supplied from the external power supply (not shown). Examples of VCC are 3.0 to 4.0 [V]. VCW is a voltage supplied from an internal power supply (not shown) and an example of VCW is 3.6 [V]. VNN is a ground potential and an example of VNN is 0.0 [V].

SLCT is a signal that becomes "H" (high level: VCC) when any one of the word lines WL [n:0] is selected, irrespective to the normal operation or the high voltage operation. The signal SLCT becomes "L" (low level: 0 V) when none of the word lines is selected, irrespective to the normal operation or the high voltage operation.

When the signal SLCT becomes "H", HVXPB [n:0] corresponding to the selected word line number becomes 0.0 [V] irrespective to the normal operation and the high voltage operation. Accordingly, in the normal operation, 3.6 [V] is supplied to the corresponding word line WL. Thus, in the high voltage operation, 10.0 [V] is supplied to the corresponding word line WL.

HV_SLCTB is a signal that becomes "H" (VCW in the normal operation and VPP in the high voltage operation) in the non-selection of the word line.

XPB is a signal that becomes "L" when a word line is selected, and becomes "H" when the word line is not selected, irrespective to the normal operation or the high voltage operation.

VWLX is a signal that becomes VCW in the normal operation, and becomes VPP in the high voltage operation, irrespective to the selection or the non-selection of a word line.

Hereinafter, an operation for selecting the word line WL0 and supplying VCW to the word line WL0 will be described as an example for the selecting a word line in the normal operation.

In this case, SLCT="H", HVXPB [0]=0.0 [V], XPB [0]="L", HVXPB [n:1]=VCW=3.6 [V], and XPB [n:1]="H" are input. Here, n is a positive integer, and HVXPB [n:0] and XPB [n:0] correspond to n+1 lines of word lines WLn to WL0.

In this case, the level shift circuit 102 shifts the input SLCT="H"=VCC to HV_SLCTB="L"=0.0 [V], and outputs the shifted signal to the word line selection circuit 104.

The inverse signal of SLCT="H" is input to the gates of the NMOS transistors N500 to N50$n$ of the word line selection circuit 104 by the inverter 106. Accordingly, all the NMOS transistors N500 to N50$n$ become a non-conductive state.

When the word line WL0 is selected, HV_SLCTB is "L" and HVXPB [0] is "L", and the high-voltage PMOS transistors P103 and P200 are in a conductive state. Further, the NMOS transistor N300 are in a non-conductive state based on XPB [0]="L". Accordingly, the word line WL0 is connected to VWLX=VCW=3.6 [V] and is disconnected from VNN=0.0 [V], and, therefore, WL0 becomes VCW=3.6 [V]. Since the other word lines WL are disconnected from the signal VWLX based on HVXPB [n:1]=VCW=3.6 [V] and XPB [n:1]="H" and are connected to the signal VNN, WL [n:1] become 0.0 [V].

When SLCT="H", HVXPB [n:0]=0.0[V], and XPB [n:0]="L", all the word lines WL [n:0] may be selected, as in the above-described case of the selection of the word line WL0. Accordingly, WL [n:0] become VCW=3.6 [V].

Next, an operation when none of the word lines WL [n:0] is selected, will be described. In this case, SLCT="L" is input. For HVXPB [n:0], input of VCW=3.6 [V] or VCW=0.0 [V] is allowed, and for XPB [n:0] an arbitrary input value of "H" or "L" is allowed.

When SLCT is "L", HV_SLCTB become "H"=3.6 [V]. Due thereto, the high-voltage PMOS transistor P103 becomes a non-conductive state. On the other hand, all the NMOS transistors N500 to N50$n$, into which the inverse signal of the signal SLCT is input, become a conductive state. Thus, since the word lines WL [n:0] are disconnected from the signal VWLX, and are connected to the signal VNN, WL [n:0] become 0.0 [V].

Next, an operation for selecting the word line WL0 and supplying VPP=10.0 [V] to WL0 will be described, as an example for the selecting a word line in the high voltage operation. In this case, SLCT="H", HVXPB [0]=0.0 [V], XPB [0]="L", HVXPB [n:1]=VPP=10.0 [V], and XPB [n:1]="H" are input.

The level shift circuit 102 shifts SLCT="H"=VCC to HV_SLCTB="L"=0.0 [V] and outputs the shifted signal to the word line selection circuit 104, as in the normal operation.

The inverse signal of SLCT="H", inverted by the inverter 106, is input to the gates of the NMOS transistors N500 to N50$n$ of the word line selection circuit 104. Therefore, all the NMOS transistors N500 to N50$n$ become a non-conductive state.

When the word line WL0 is selected, HVXPB [0] is "L", XPB [0] is "L", HVXPB [n:1] are VPP=10.0 [V], and XPB [n:1] are "H". Thus, the high-voltage PMOS transistors P103 and P200 become a conductive state based on HV_SLCTB=0.0 [V] and HVXPB [0]=0.0 [V]. The NMOS transistor N300 becomes a non-conductive state based on XPB [0]="L". Due thereto, the word line WL0 is connected to VWLX=VPP=10.0 [V] and is disconnected from VNN=0.0 [V]. Accordingly, WL0 becomes VPP=10.0 [V]. Since the other word lines WL are disconnected from the signal VWLX based on HVXPB [n:1]=VPP=10.0 [V] and XPB [n:1]="H" and are connected to the signal VNN, WL [n:1] become 0.0 [V].

Note that when SLCT="H", HVXPB [n:0]=0.0 [V], and XPB [n:0]="L", all the word lines WL [n:0] may be selected, as in the above-described case of the selection of the word line WL0. Accordingly, WL [n:0] become VPP=10.0 [V].

Next, an operation for selecting none of the word lines WL [n:0] will be described. In this case, SLCT="L" is input. For HVXPB [n:0], VPP=10.0 [V] or VPP=0.0 [V] may be input, and for XPB [n:0] an arbitrary input value of "H" or "L" may be input.

By inputting SLCT="L", HV_SLCTB becomes "H"=10.0 [V]. Therefore, the high-voltage PMOS transistor P103 becomes a non-conductive state. On the other hand, all the NMOS transistors N500 to N50$n$, into which the inverse signal of the signal SLCT is input, become a conductive state. Thus, since the word lines WL [n:0] are disconnected from the signal VWLX, and is connected to the signal VNN, WL [n:0] become 0.0 [V]. FIG. 16 is a diagram illustrating the voltage state of the selection of a word line in the high voltage operation. Further, FIG. 17 is a diagram illustrating the voltage state of the non-selection of a word line in the high voltage operation.

As shown in FIG. 16 and FIG. 17, in the conventional row decoder 100, the high voltage in the range from 0.0 [V] to 10.0 [V] is applied to the electrodes of the PMOS transistors P101 and P102 of the level shift circuit 102, and the PMOS transistors P103, P200, P201, ..., P20$n$ of the word line selection circuit 104. Therefore, in the conventional row decoder 100, these transistors have to resist the high voltage. Accordingly, the conventional row decoder 100 may not perform an operation at high speed and the circuit area of the driver circuit may increase.

SUMMARY OF THE INVENTION

The present invention provides a decoder circuit of a semiconductor storage device that may prevent an increase in the area of a circuit and that may maintain a high operation speed.

A first aspect of the present invention is a decoder circuit of a semiconductor storage device, including: a word line selection circuit that includes voltage application MOS transistors corresponding to each of a plurality of word lines that apply a normal voltage to the word lines corresponding to memory cells selected among a plurality of memory cells positioned at a portion where the plurality of word lines intersect a plurality of bit lines in a predetermined normal operation, and that applies a high voltage higher than the normal voltage in a predetermined high voltage operation; and a level shift circuit that outputs, to the voltage application MOS transistor, at least one of the normal voltage or a ground voltage lower than the normal voltage according to a selection state of the word line in the normal operation, and that outputs, to the voltage application MOS transistor, at least one of the normal voltage or the high voltage according to a selection state of the word line in the high voltage operation.

A second aspect of the present invention, in the first aspect, the voltage application MOS transistors of the word line selection circuit may include PMOS transistors, the word line selection circuit may include a control PMOS transistor that controls output of a voltage to the voltage application MOS transistor, including a source to which the normal voltage is input when the word line selection circuit performs the normal operation, and to which the high voltage is input when the word line selection circuit performs the high voltage operation, and a drain connected to a source of the voltage application MOS transistor, and the level shift circuit may include, a PMOS transistor including a source to which the normal voltage is input in the normal operation, and to which the high voltage is input in the high voltage operation, and a gate to which the normal voltage is input when the word line is selected in the normal operation, to which the ground voltage is input when the word line is not selected in the normal operation, and to which the normal voltage is constantly input in the high voltage operation, a first DMOS transistor, connected to the PMOS transistor in series, including a gate and a source connected to a gate of the control PMOS transistor, a second DMOS transistor, connected to the first DMOS transistor in series, including a gate to which a selection signal, that becomes active when the word line is selected, is input, a first NMOS transistor, connected to the second DMOS transistor in series, including a gate to which the selection signal is input, and a second NMOS transistor, connected to the first NMOS transistor in parallel, including a gate to which the ground voltage is input in the normal operation, and to which the high voltage is input in the high voltage operation, and a source to which the ground voltage is input in the normal operation, and to which the normal voltage is input in the high voltage operation.

A third aspect of the present invention, in the first aspect, the voltage application MOS transistors of the word line selection circuit may include PMOS transistors including a source to which the normal voltage is input in the normal operation and to which the high voltage is input in the high voltage operation, and the level shift circuit may include, a PMOS transistor including a source to which the normal voltage is input in the normal operation, and to which the high voltage is input in the high voltage operation, and a gate to which the normal voltage is input when the word line is selected in the normal operation, to which the ground voltage is input when the word line is not selected in the normal operation, and to which the normal voltage is constantly input in the high voltage operation, a first DMOS transistor, connected to the PMOS transistor in series, including a gate and a source connected to a gate of the voltage application MOS transistor, a second DMOS transistor, connected to the first DMOS transistor in series, including a gate to which a selection signal, that becomes active when the word line is selected, is input, a first NMOS transistor, connected to the second DMOS transistor in series, including a gate to which the selection signal is input, and a second NMOS transistor, connected to the first NMOS transistor in parallel, including a gate to which the ground voltage is input in the normal operation, and to which the high voltage is input in the high voltage operation, and a source to which the ground voltage is input in the normal operation, and to which the normal voltage is input in the high voltage operation.

A fourth aspect of the present invention, in the above aspect, may further include a third DMOS transistor connected to the first DMOS transistor in parallel.

According to the present invention, an increase in the area of a circuit may be prevented, and a high operation speed may be maintained.

BRIEF DESCRIPTION OF THE DRAWINGS

Exemplary embodiments of the present invention will be described in detail based on the following figures, wherein:

FIG. 3 is a chart illustrating signals of the portions of the row decoder according to the first exemplary embodiment;

FIG. 6 is a chart illustrating signals of the portions of the row decoder according to the second exemplary embodiment;

FIG. 11 is a chart illustrating signals of the portions of the row decoder according to the third exemplary embodiment;

FIG. 14 is a chart illustrating signals of the portions of the conventional row decoder;

DETAILED DESCRIPTION OF THE INVENTION

Hereinafter, exemplary embodiments of the present invention will be described in detail with reference to the drawings.

First Exemplary Embodiment

Figure 13:
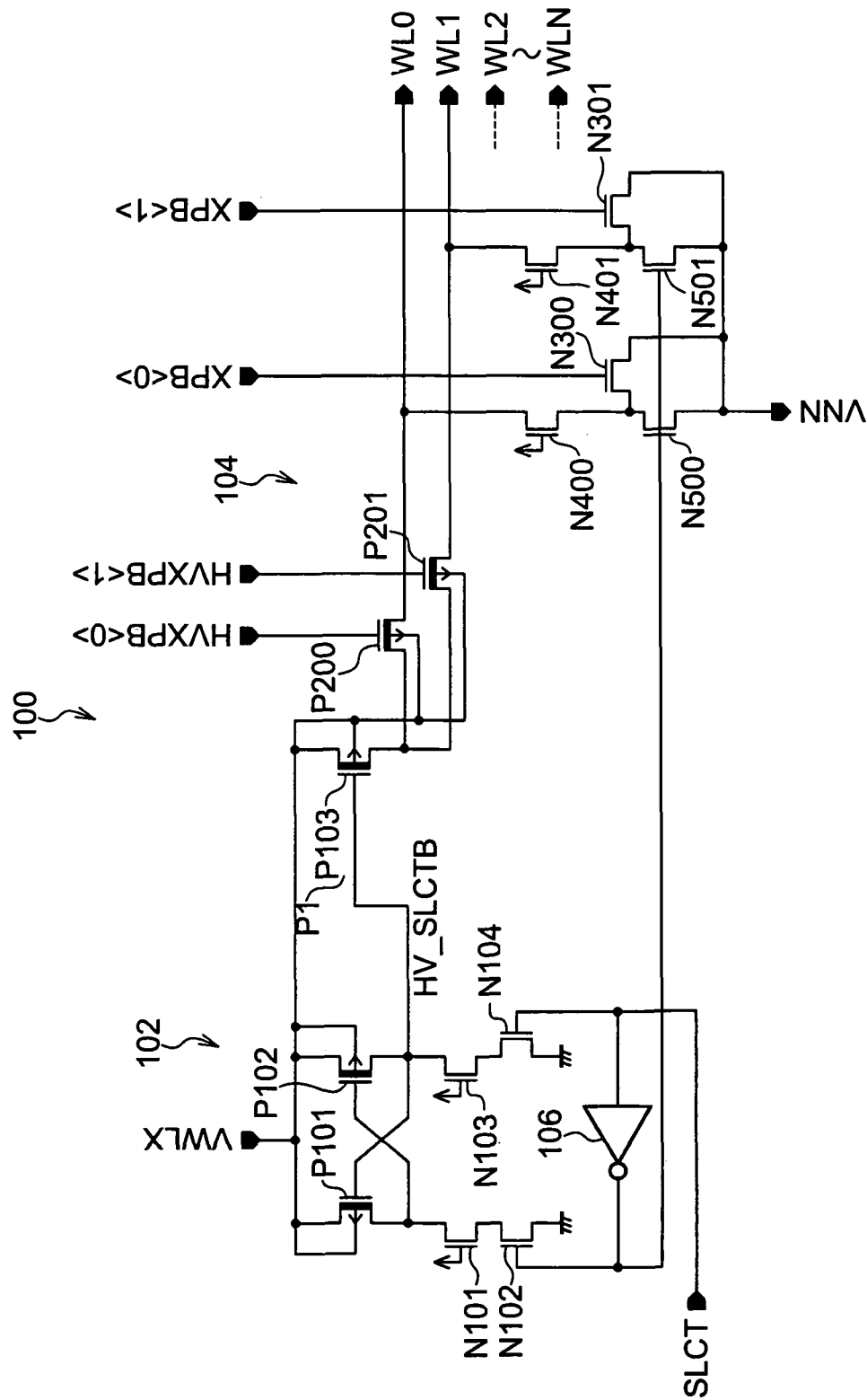
FIG. 13 is a circuit diagram illustrating a conventional row decoder.
Figure 15A:
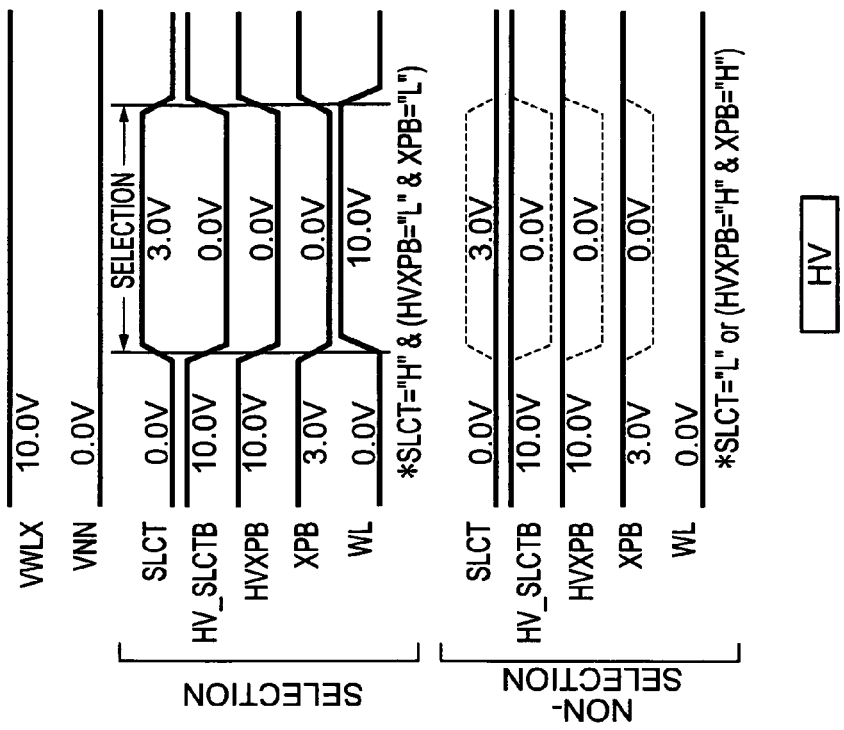
FIG. 15A is a diagram illustrating the voltages at the portions of the conventional row decoder in normal operation.
Figure 15B:
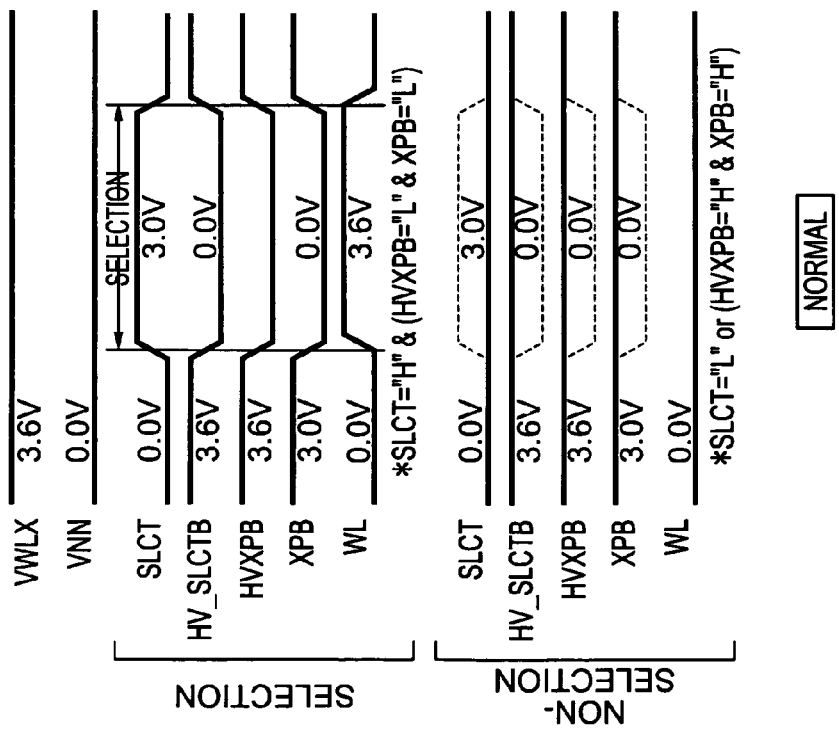
FIG. 15B is a diagram illustrating the voltages at the portions of the conventional row decoder in high voltage operation.
Figure 16:
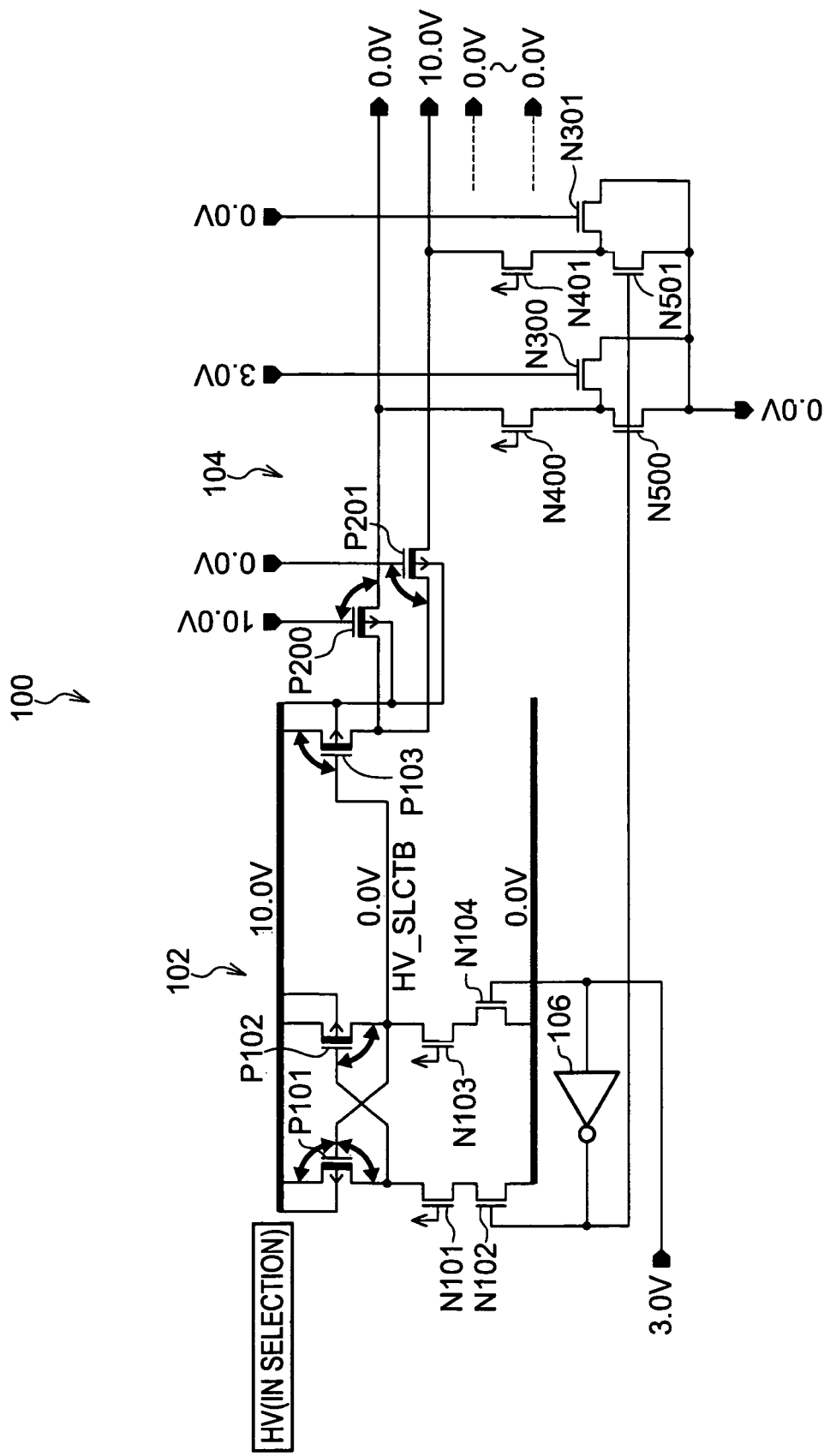
FIG. 16 is a diagram illustrating the voltage at the portions of the conventional row decoder when a word line is selected in the high voltage operation.
Figure 17:
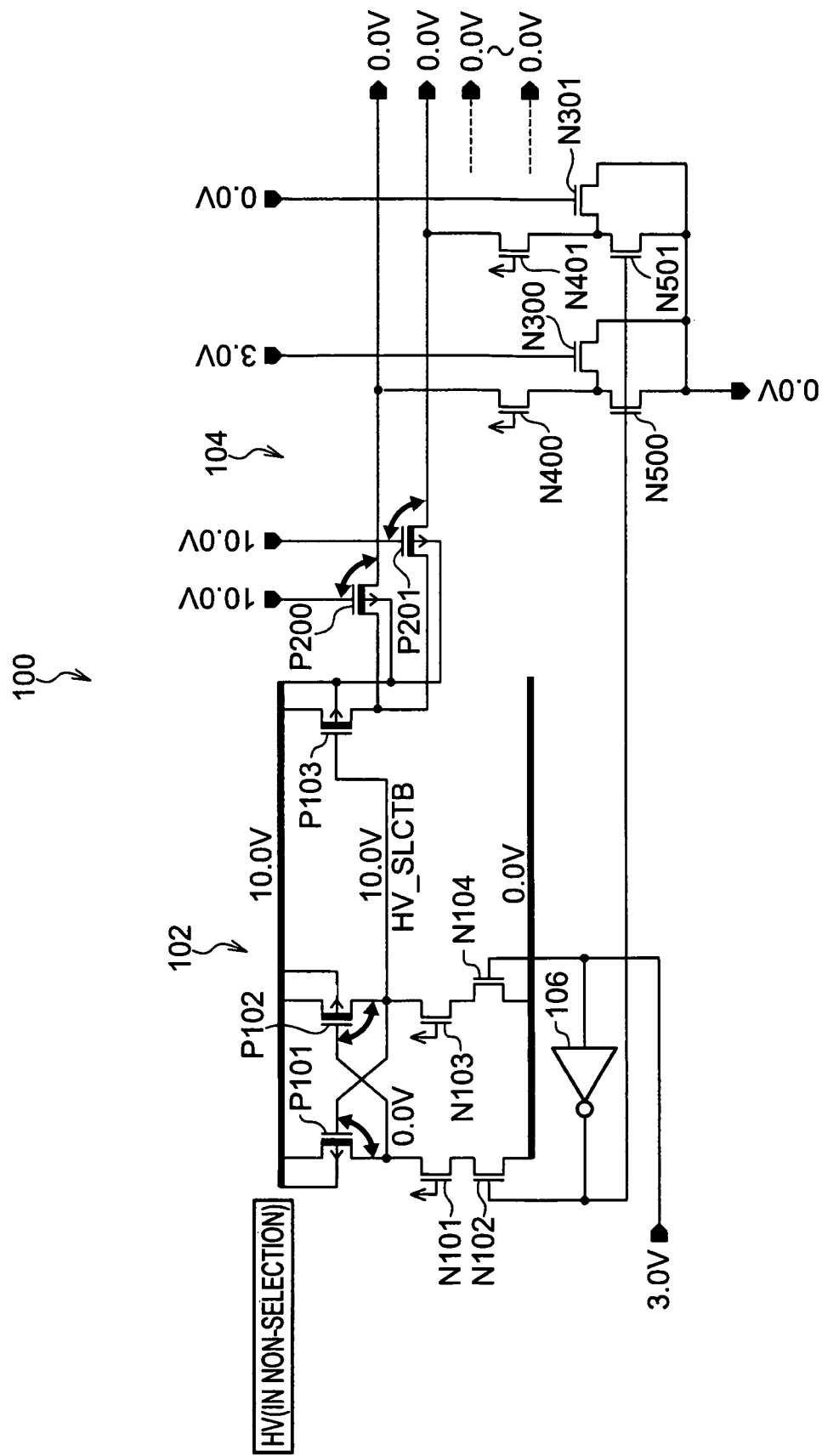
FIG. 17 is a diagram illustrating the voltage at the portions of the conventional row decoder when no word line is selected in the high voltage operation.

Hereinafter, a first exemplary embodiment of the present invention will be described. The same reference numerals are given to the same portions as those of FIG. 13 and FIG. 14 described above, and the detailed description thereof will be omitted.

Figure 1:
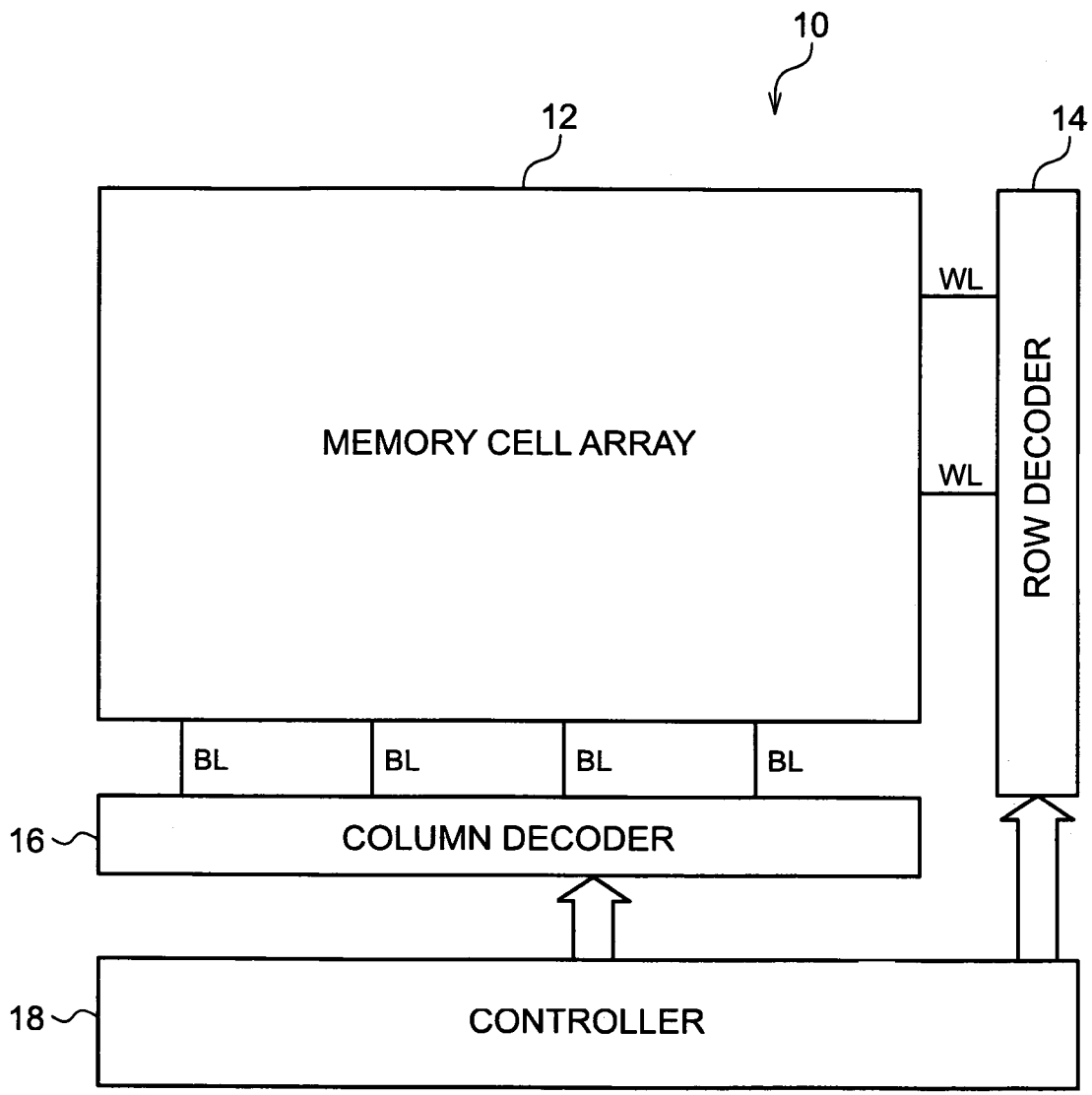
FIG. 1 is a schematic diagram illustrating a configuration of a semiconductor storage device according to a first exemplary embodiment.

FIG. 1 is a schematic diagram illustrating a configuration of a semiconductor storage device 10. As shown in FIG. 1, the semiconductor storage device 10 includes a memory cell array 12 in which plural memory cells including a MOS transistor or the like are arranged. Namely, in the memory cell array 12, plural word lines WL disposed in a column direction are arranged to intersect plural bit lines BL disposed in a row direction perpendicular to the column direction. In the memory cell array 12, memory cells (not shown) are disposed at the intersecting portion of the word lines WL and the bit lines BL, respectively.

A gate of each memory cell is connected to the word line WL. A source and a drain of each memory cell are connected to the bit line BL.

The word lines WL are connected to a row decoder 14, and the bit lines BL are connected to a column decoder 16. The row decoder 14 and the column decoder 16 are connected to a controller 18.

The controller 18 controls an operation such as writing, reading, or erasing of data to/or/from the memory cell array 12. When receiving operation for any one of writing, reading, and erasing of data from the outside, the controller 18 outputs voltages or signals to the row decoder 14 or the column decoder 16, to select the word lines WL or the bit lines BL depending on the details of the received operation.

Figure 2:
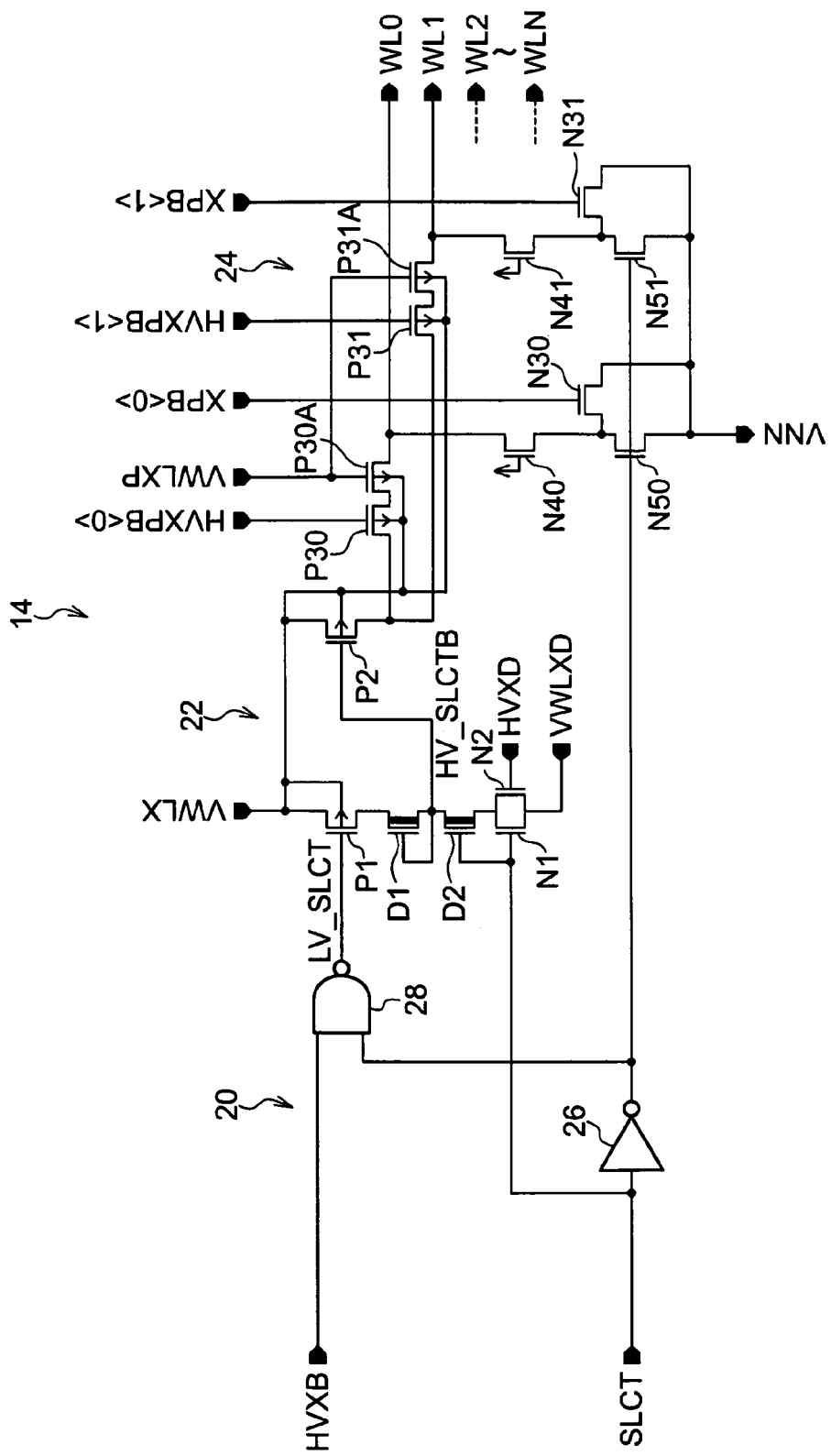
FIG. 2 is a circuit diagram illustrating a row decoder according to the first exemplary embodiment.

FIG. 2 is a circuit diagram illustrating the row decoder 14 according to this exemplary embodiment. As shown in FIG. 2, the row decoder 14 includes an LV_SLCT signal output circuit 20, a level shift circuit 22, and a word line selection circuit 24.

The LV_SLCT output circuit 20 includes an inverter 26 and an NAND circuit 28. A signal HVXB from the controller 18 is input to one input terminal of the NAND circuit 28. An output signal of the inverter 26 is input to the other input terminal of the NAND circuit 28. The NAND circuit 28 outputs a signal LV_SLCT, which is a negative logic signal of the inputted signals, to the level shift circuit 22.

The level shift circuit 22 includes a PMOS transistor P1, DMOS transistors D1 and D2, and NMOS transistors N1 and N2.

Signals LV_SLCT, SLCT, VWLX, HVXD, and VWLXD are input from the controller 18 to the level shift circuit 22, and a signal HV_SLCTB is output to the word line selection circuit 24, depending on the input status of the above signals.

The word line selection circuit 24 includes a PMOS transistor P2; PMOS transistors P30, P31, . . . , P3$n$ disposed for each HVXPB [n:0] signals; PMOS transistors P30A, P31A, . . . , P3$n$A to which a signal VWLXP is input and which are disposed in accordance with the number lines of word lines WL; and NMOS transistors N30, N31, . . . , N3$n$, N40, N41, . . . , N4$n$, and N50, N51, . . . , N5$n$ disposed for each XPB [n:0] signals.

Figure 4A:
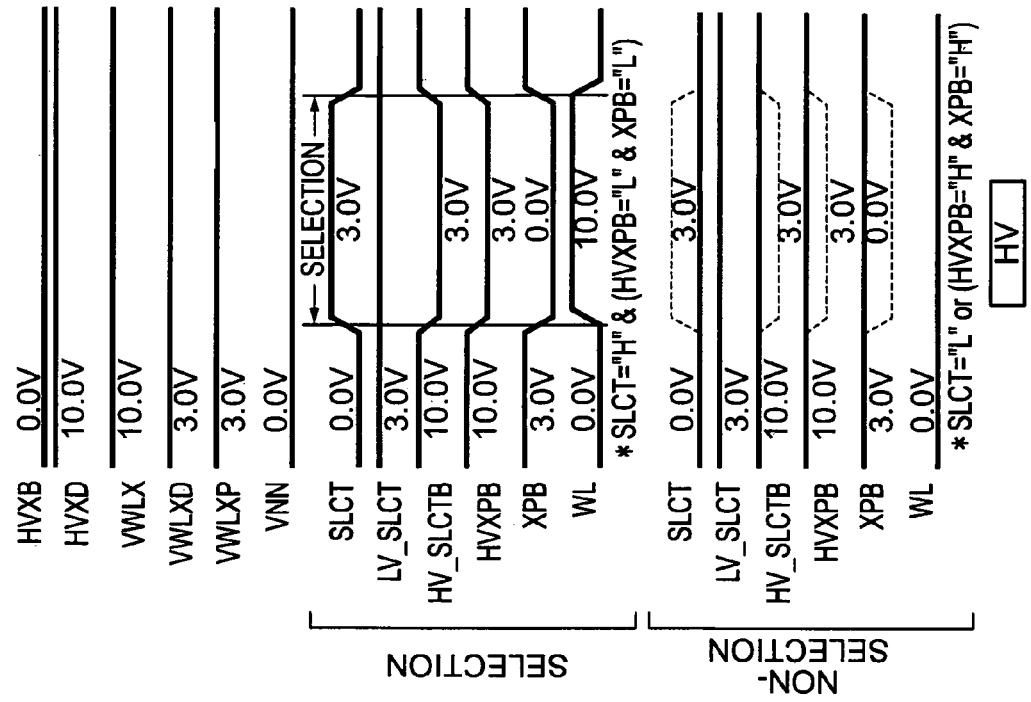
FIG. 4A is a diagram illustrating the voltages at the portions of the row decoder in normal operation, according to the first exemplary embodiment.
Figure 4B:
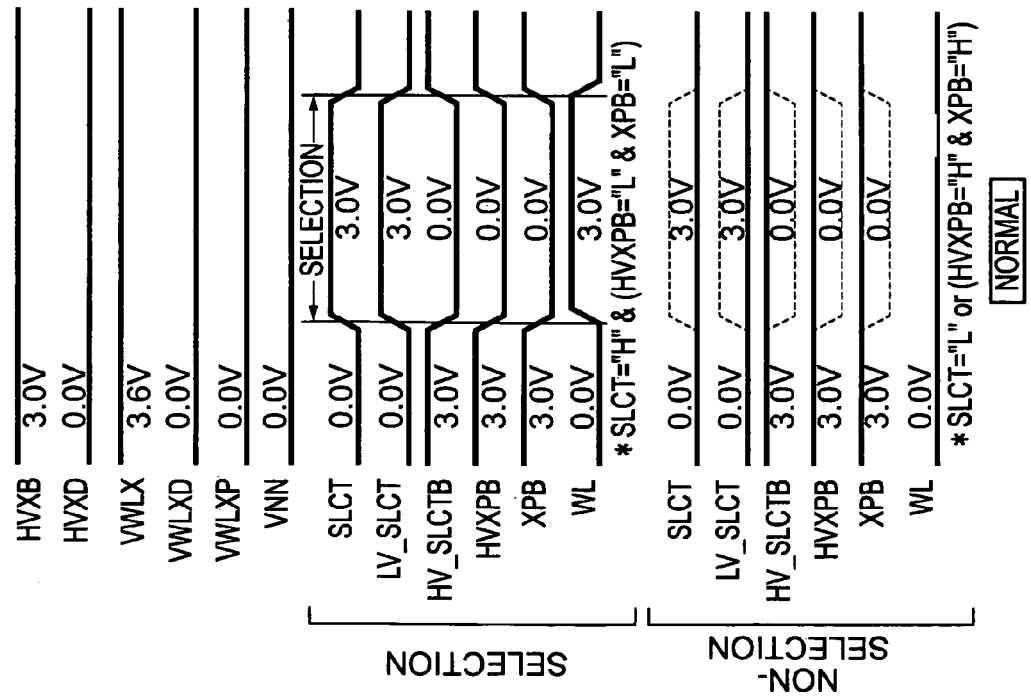
FIG. 4B is a diagram illustrating the voltages at the portions of the row decoder in high voltage operation, according to the first exemplary embodiment.

FIG. 3 is a chart illustrating the voltage values of the signals in normal operation (NORMAL) that uses a normal voltage when reading data, and in high voltage operation (HV) that uses a high voltage, for example, when writing or erasing data, in selection and non-selection of the word lines. FIG. 4A is a diagram illustrating a timing chart of the respective signals in the normal operation. FIG. 4B is a diagram illustrating a timing chart of the respective signals in the high voltage operation.

VPP shown in FIG. 3 is a high voltage supplied from an external power supply (not shown). An example of VPP is 10.0 [V]. VCC is a voltage supplied from the external power supply (not shown). Examples of VCC are 3.0 to 4.0 [V]. VNN is a ground potential and an example of VNN is 0.0 [V].

Irrespective to the normal operation or the high voltage operation, SLCT becomes "H" when any one of the word lines WL [n:0] is selected. Further, irrespective to the normal operation or the high voltage operation, the SLCT becomes "L" when none of the word lines are selected. Here, "H" is VCC=3.0 [V] and "L" is 0.0 [V].

When the SLCT becomes "H", HVXPB [n:0] corresponding to the selected word line becomes 3.0 [V] in the normal operation, and becomes 10.0 [V] in the high voltage operation. Accordingly, in the normal operation, 3.0 [V] is supplied to the selected word line WL, and in the high voltage operation, 10.0 [V] is supplied to the selected word line WL.

HVXB becomes "H" in the normal operation and becomes "L" in the high voltage operation, irrespective to the selection or the non-selection of a word line.

VWLX becomes 3.0 [V] in the normal operation and becomes 10.0 [V] in the high voltage operation, irrespective to the selection or the non-selection of a word line.

HVXD becomes 0.0 [V] in the normal operation and becomes 10.0 [V] in the high voltage operation, irrespective to the selection or the non-selection of a word line.

VWLXD becomes 0.0 [V] in the normal operation and becomes 3.0 [V] in the high voltage operation, irrespective to the selection or the non-selection of a word line.

XPB becomes "L" in the selection of a word line and becomes "H" in the non-selection of a word line, irrespective to the normal operation or the high voltage operation.

VNN is 0.0 [V] irrespective to the selection of a word line, the non-selection of a word line, the normal operation, and the high voltage operation.

First, an operation for selecting a word line in the normal operation will be described.

When selecting a word line WL, the controller 18 outputs the signal HVXB="H" to the LV_SLCT output circuit 20.

Further, the controller 18 outputs HVXD=0.0 [V], VWLXD=0.0 [V], and the VWLX=VCC=3.0 [V] to the level shift circuit 22.

Furthermore, the controller 18 outputs VWLXP=0.0 [V] and VNN=0.0 [V] to the word line selection circuit 24.

Hereinafter, an operation for selecting the word line WL0 and supplying the signal VCC to the word line WL0, will be described as an example for selecting a word line in the normal operation. Note that, "H"=VCC=3.0 [V] and "L"=0.0 [V].

In this case, the controller 18 outputs SLCT="H", HVXPB [0]=0.0 [V], XPB [0]="L", HVXPB [n:1]=VCC=3.0 [V], and XPB [n:1]="H" to each circuit. Note that, n is a positive integer, and HVXPB [n:0] and XPB [n:0] correspond to n+1 lines of the word lines WL.

An operation of the LV_SLCT output circuit 20 will be described. The LV_SLCT output circuit 20 operates as LV_SLCT=SLCT based on HVXB="H". Accordingly, LV_SLCT becomes "H" because of SLCT="H".

Next, an operation of the level shift circuit 22 will be described. DMOS transistors D1 and D2 are in a conductive state based on HVXD=0.0 [V], VWLXD=0.0 [V], and VWLX=VCC=3.0 [V], irrespective to the logical value of SLCT and LV_SLCT. Therefore, the level shift circuit 22 operates as an inverter circuit configured by the PMOS transistor P1 and the NMOS transistor N1. Accordingly, the level shift circuit 22 outputs the LV_SLCT="H" input from the LV_SLCT output circuit 20, as HV_SLCTB="L" to the word line selection circuit 24.

Hereinafter, an operation of the word line selection circuit 24 will be described. All the NMOS transistors N50, N51, . . . , N5$n$ in which the inverse logic of SLCT is input to the gates become a non-conductive state based on SLCT="H". Here, to select the word line WL0, HVXPB [0] is 0.0 [V], XPB [0] is "L", HVXPB [n:1] are VCC=3.0 [V], and XPB [n:1] are "H". The PMOS transistors P2, P30, and P30A become a conductive state based on HV_SLCTB="L", HVXPB [0]=0.0 [V], and VWLXP=0.0 [V]. The NMOS transistor N30 becomes a non-conductive state based on XPB [0]="L". Due thereto, the word line WL0 is connected to VWLX=VCC=3.0 [V] and is disconnected from VNN=0.0 [V]. Accordingly, word line WL0 becomes VCC=3.0 [V]. Further, the other word lines WL are disconnected from VWLX and are connected to VNN based on HVXPB [n:1]=3.0 [V] and XPB [n:1]="H". Accordingly, WL [n:1] become 0.0 [V].

Note that when SLCT="H", HVXPB [n:0]=0.0 [V], and XPB [n:0]="L", all the word lines WL [n:0] may be selected, as in the above-described case of the selection of the word line WL0. Accordingly, WL [n:0] become VCC=3.0 [V].

Next, an operation for selecting none of the word lines WL [n:0] will be described. In this case, the controller 18 outputs SLCT="L" to the LV_SLCT output circuit 20. For HVXPB [n:0], an in put of VCC=3.0 [V] may be input, and for XPB [n:0] an arbitrary input value of "H" or "L" may be input.

By inputting SLCT="L", LV_SLCT=0.0 [V] becomes HV_SLCTB=3.0 [V]. Therefore, the PMOS transistor P2 becomes a non-conductive state. On the other hand, all the NMOS transistors N50, N51, . . . , N5$n$, into which the inverse logic of the signal SLCT is input, become a conductive state. Due thereto, the word lines WL [n:0] are disconnected from the signal VWLX and are connected to the signal VNN. Accordingly, WL [n:0] become 0.0 [V].

Next, an operation for selecting a word line while in the high voltage operation will be described.

The controller 18 outputs SLCT="H" and HVXB="L" to the LV_SLCT output circuit 20. The controller 18 outputs HVXD=VPP=10.0 [V], VWLXD=3.0 [V], and VWLX=VPP=10.0 [V] to the level shift circuit 22. The controller 18 outputs VWLXP=3.0 [V] and VNN=0.0 [V] to the word line selection circuit 24. Note that, "H"=VCC=3.0 [V] and "L"=0.0 [V].

In the voltage value, SLCT of the level shift circuit 22, HV_SLCTB of the level shift circuit 22, and HVXPB [n:0] and XPB [n:0] of the word line selection circuit 24 are different from each other, depending on the selection of a word line WL.

Hereinafter, an operation for selecting the word line WL0 and supplying WL0=VPP=10.0 [V] will be described, as an example for the selecting a word line. In this case, the controller 18 outputs SLCT="H", HVXPB [0]=VCC=3.0 [V], XPB [0]="L", HVXPB [n:1]=VPP=10.0 [V], and XPB [n:1]="H" to each circuit. Note that, n is a positive integer, and HVXPB [n:0] and XPB [n:0] correspond to n+1 lines of word lines WL.

An operation of the LV_SLCT output circuit 20 will be described. The signal LV_SLCT output from the LV_SLCT output circuit 20 is fixed to LV_SLCT=VCC=3.0 [V] based on SLCT="H" and HVXB="L".

Next, an operation of the level shift circuit 22 will be described. Irrespective to the logical value of the signal SLCT, the PMOS transistor P1 and the NMOS transistor N2 are in a conductive state based on LV_SLCT=3.0 [V], HVXD=VPP=10.0 [V], VWLXD=3.0 [V], and VWLX=VPP=10.0 [V].

When the gate voltage of the DMOS transistor D2 is equal to "H"=3.0 [V] based on SLCT="H", the DMOS transistor D2 is connected to the signal VWLXD, so that the voltage of the signal HV_SLCTB is lowered. When the voltage of the signal HV_SLCTB is lowered, the driving force of the DMOS transistor D1 connected to the signal HV_SLCTB is further lowered. At this time, in order to lower the voltage of the signal HV_SLCTB to near VWLXD=3.0 [V], the driving force of the DMOS transistor D1 is adjusted to be considerably lower than the driving force of the DMOS transistor D2.

On the contrary, when no word line is selected, SLCT="L" is input to the level shift circuit 22. When the gate voltage of the DMOS transistor D2 is "L"=0.0 [V], the DMOS transistor D2 becomes a non-conductive state based on a source voltage=VWLXD=3.0 [V].

On the other hand, the DMOS transistor D1 maintains the conductive state. Therefore, the signal HV_SLCTB increases up to VWLX=10.0 [V]. Thus, the level shift circuit 22 operates as a level shifter, configured by the DMOS transistors D1 and D2, that shifts the voltage range of VCC=3.0 [V]/0.0 [V] to the voltage range of VPP=10.0 [V]/VCC=3.0 [V], and as an inverter circuit. Note that, a relation of HV_SLCTB becomes 3.0 [V] from SLCT="H"=3.0 [V].

An operation of the word line selection circuit 24 will be described. All the NMOS transistors N50, N51, . . . , N5n, in which the inverse logic of the signal SLCT is input to the gate terminal, become a conductive state based on SLCT="H". Note that, since the word line WL0 is selected, HVXPB [0] becomes 3.0 [V], XPB [0] becomes "L", HVXPB [n:1] become VPP=10.0 [V], and XPB [n:1] become "H".

The PMOS transistors P2, P30, and P30A become a conductive state based on relations of HV_SLCTB=3.0 [V], HVXPB [0]=3.0 [V], and VWLXP=3.0 [V]. The NMOS transistor N30 becomes a non-conductive state based on XPB[0]="L". Thus, the word line WL0 is connected to VWLX=VPP=10.0 [V] and is disconnected from VNN=0.0 [V]. Therefore, WL0 becomes VPP=10.0 [V]. Further, the other word lines WL1 to WLn are disconnected from VWLX, and are connected to the signal VNN based on HVXPB [n:1]=VPP=10.0 [V] and XPB [n:1]="H". Therefore, WL [n:1] become 0.0 [V].

When SLCT="H", HVXPB [n:0]=3.0 [V], and XPB [n:0]="L", all the word lines WL [n:0] may be selected, as in the above-described case of the selection of the word line WL0. Accordingly, WL [n:0] become VPP=10.0 [V].

Next, an operation for selecting none of the word lines WL [n:0] will be described. In this case, the controller 18 outputs SLCT="L". For HVXPB [n:0], VPP=10.0 [V] or VCC=3.0 [V] may be input, and for XPB [n:0] an arbitrary input value of "H" or "L" may be input.

By inputting SLCT="L", HV_SLCTB becomes 10.0 [V]. Therefore, the PMOS transistor P2 becomes a non-conductive state. On the other hand, all the NMOS transistors N50, N51, . . . , N5n, into which the inverse logic of SLCT is input, become a conductive state. Thus, the word line WL [n:0] are disconnected from the signal VWLX and are connected to the signal VNN. Accordingly, WL [n:0] becomes 0.0 [V].

The row decoder 14 according to the first exemplary embodiment includes the level shift circuit 22 that shifts the voltage range so that the voltage applied to the electrodes of the PMOS transistor P30 and the like of the word line selection circuit 24 is in the range from 0.0 [V] to VCC in the normal operation, and is not in the range from 0.0 [V] to VPP but in the range from VCC to VPP in the high voltage operation. Thus, it is not necessary for the row decoder 14 according to the first exemplary embodiment to use a high-voltage PMOS transistor for the PMOS transistor P30 and the like, in the word line selection circuit 24. Accordingly, in the row decoder 14 according to the first exemplary embodiment may prevent an increase in the area of a circuit, and may maintain high operation speed.

Second Exemplary Embodiment

Next, a second exemplary embodiment of the present invention will be described.

Figure 5:
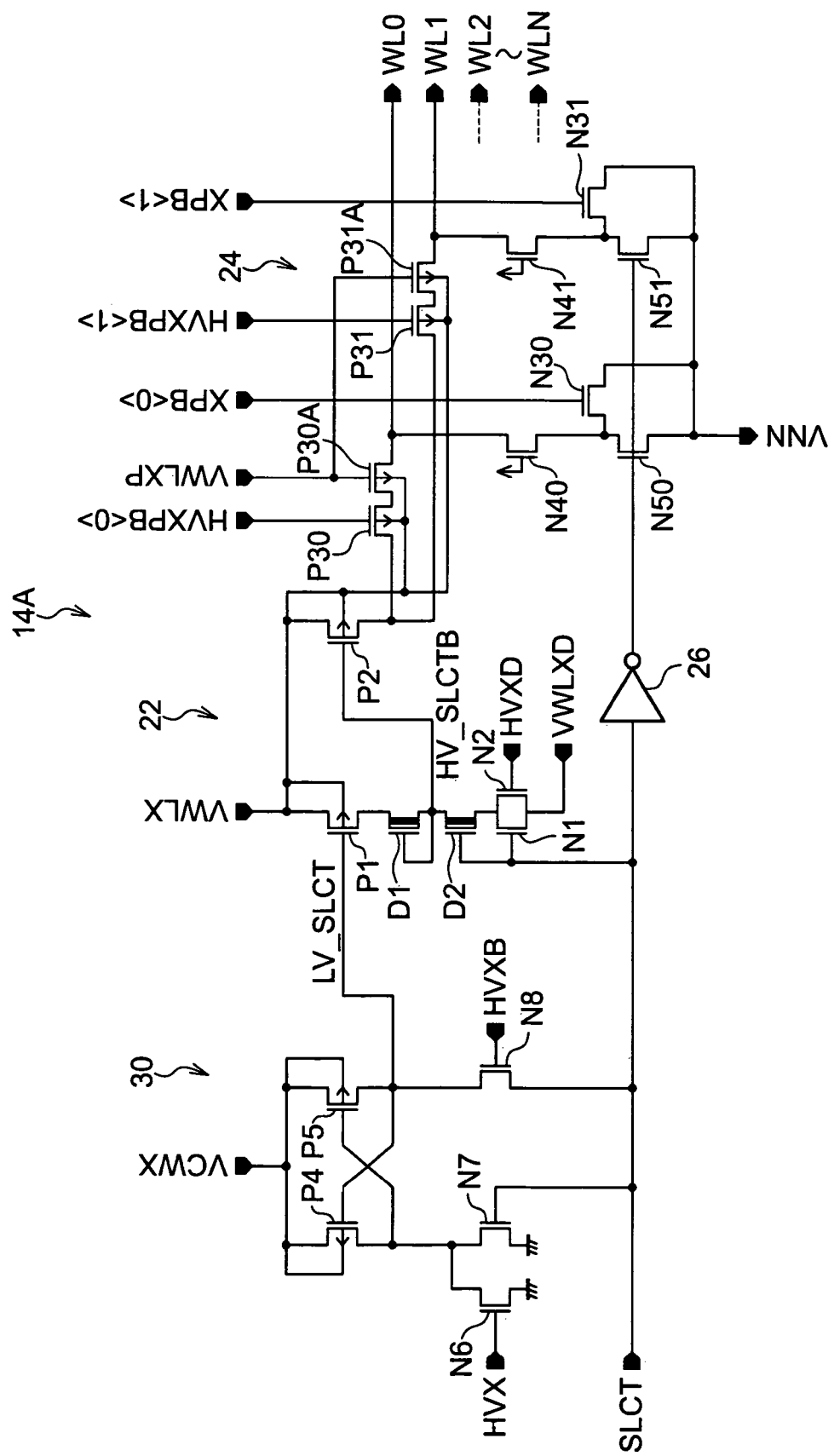
FIG. 5 is a circuit diagram illustrating a row decoder according to a second exemplary embodiment.

FIG. 5 is a circuit diagram illustrating a row decoder 14A according to the second exemplary embodiment of the present invention. The row decoder 14A according to the second exemplary embodiment is different from the row decoder 14, described with reference to FIG. 2 according to the first exemplary embodiment, in that a level shift circuit 30 is disposed instead of the LV_SLCT output circuit 20.

A level shift circuit 22 and a word line selection circuit 24 are the same of those of the row decoder 14.

In the level shift circuit 30, PMOS transistors P4 and P5 and NMOS transistors N6, N7, and N8 are connected, as shown in FIG. 5.

Figure 7A:
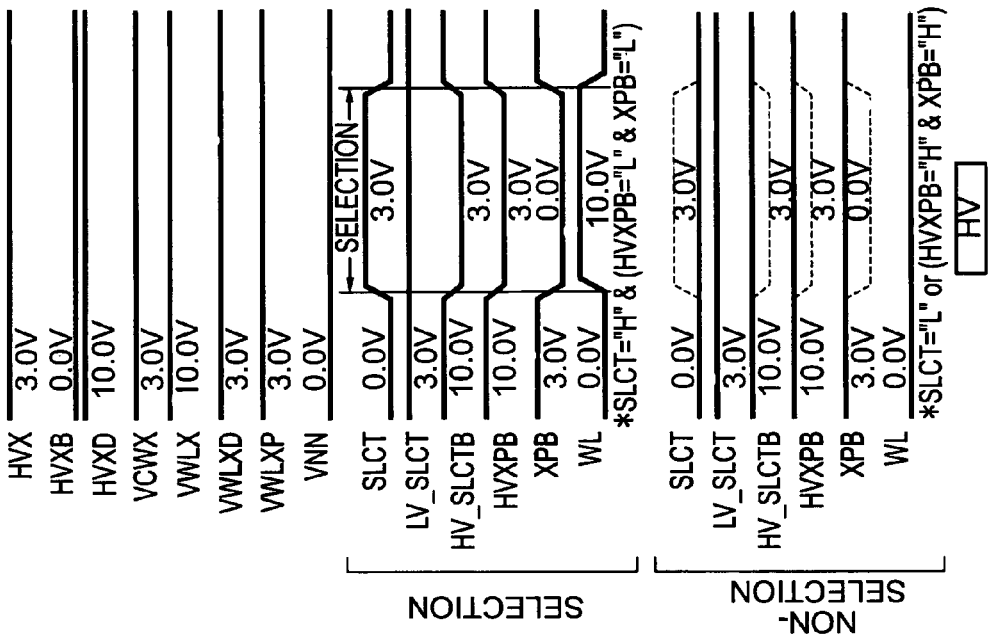
FIG. 7A is a diagram illustrating the voltages at the portions of the row decoder in normal operation, according to the second exemplary embodiment.
Figure 7B:
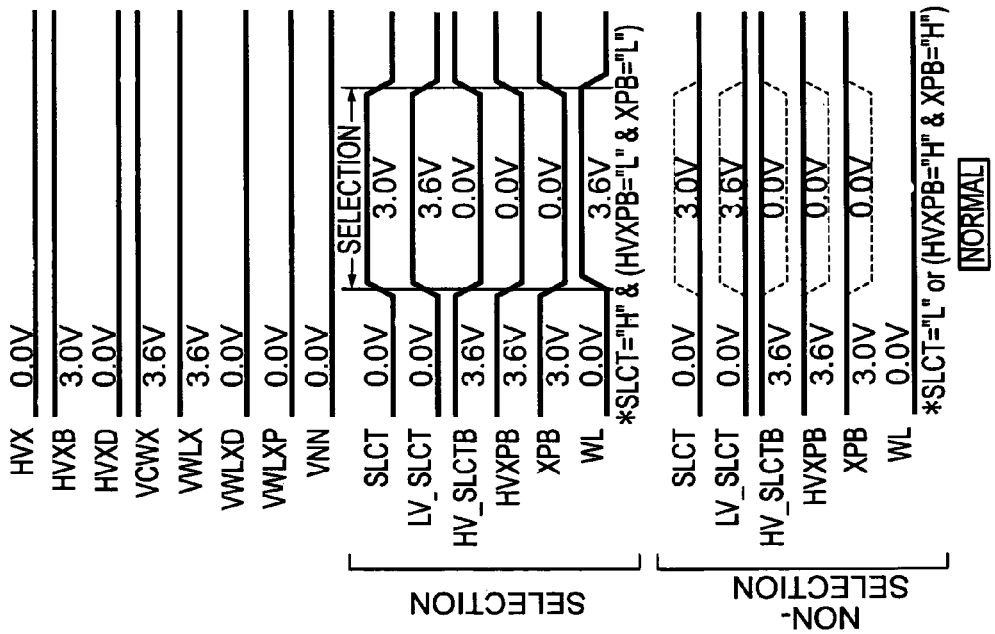
FIG. 7B is a diagram illustrating the voltages at the portions of the row decoder in high voltage operation according to the second exemplary embodiment.

In FIG. 6, the voltage values of the respective signals in normal operation (NORMAL) that uses a normal voltage when reading data, and in high voltage operation (HV) that uses a high voltage, for example, when writing or erasing data, in selection and non-selection of the word lines, are shown. In FIG. 7A, a timing chart of the respective signals in the normal operation is shown. In FIG. 7B, a timing chart of the respective signals in the high voltage operation is shown.

First, an operation for selecting a word line in the normal operation will be described.

The controller 18 outputs HVX="L", HVXB="H", and VCWX=VCW=3.6 [V] to the level shift circuit 30. A signal VCW is a voltage which is supplied from an internal power supply (not shown).

The controller 18 outputs HVXD=0.0 [V], VWLXD=0.0 [V], and VWLX=VCW=3.6 [V] to the level shift circuit 22.

The controller 18 outputs the VWLXP=0.0 [V] and the VNN=0.0 [V] to the word line selection circuit 24. Note that, "H"=VCC=3.0 [V] and "L"=0.0 [V].

The signals SLCT and LV_SLCT of the level shift circuit 30, the HV_SLCTB of the level shift circuit 22, and the signals HVXPB [n:0] and XPB [n:0] of the word line selection circuit 24, are different from each other in a voltage value, depending on the selection of a word line WL.

Hereinafter, as an example for the selecting a word line, an operation for selecting the word line WL0 and supplying WL0=VCW=3.6 [V] will be described.

In this case, the controller 18 outputs SLCT="H", HVXPB [0]=0.0 [V], XPB [0]="L", HVXPB [n:1]=VCW=3.6 [V], and XPB [n:1]="H" to each circuit. Note that, n is a positive integer, and HVXPB [n:0] and XPB [n:0] correspond to n+1 lines of word lines WL.

Figure 8:
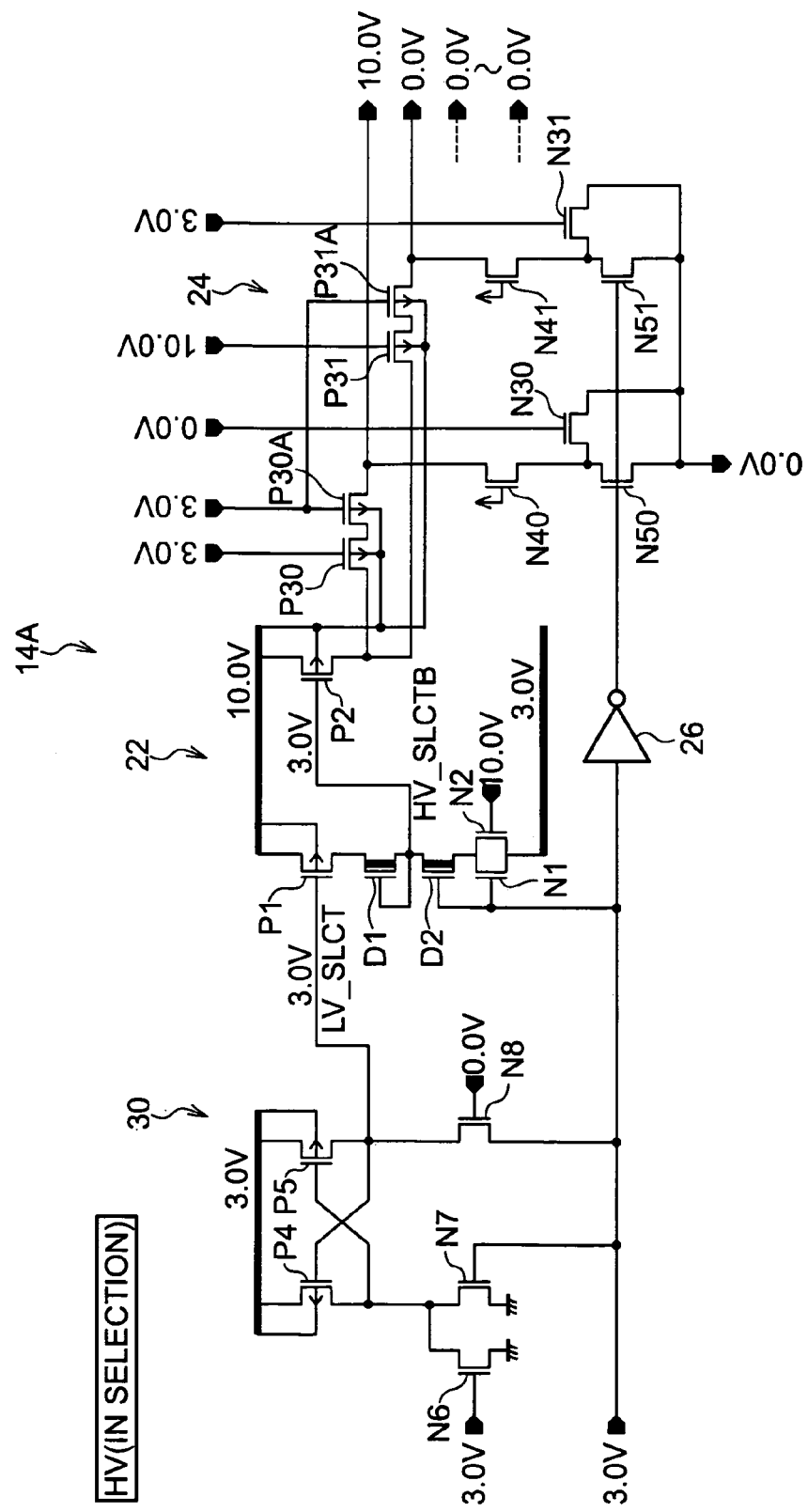
FIG. 8 is a diagram illustrating the voltage at the portions of the row decoder when a word line is selected in the high voltage operation, according to the second exemplary embodiment.
Figure 9:
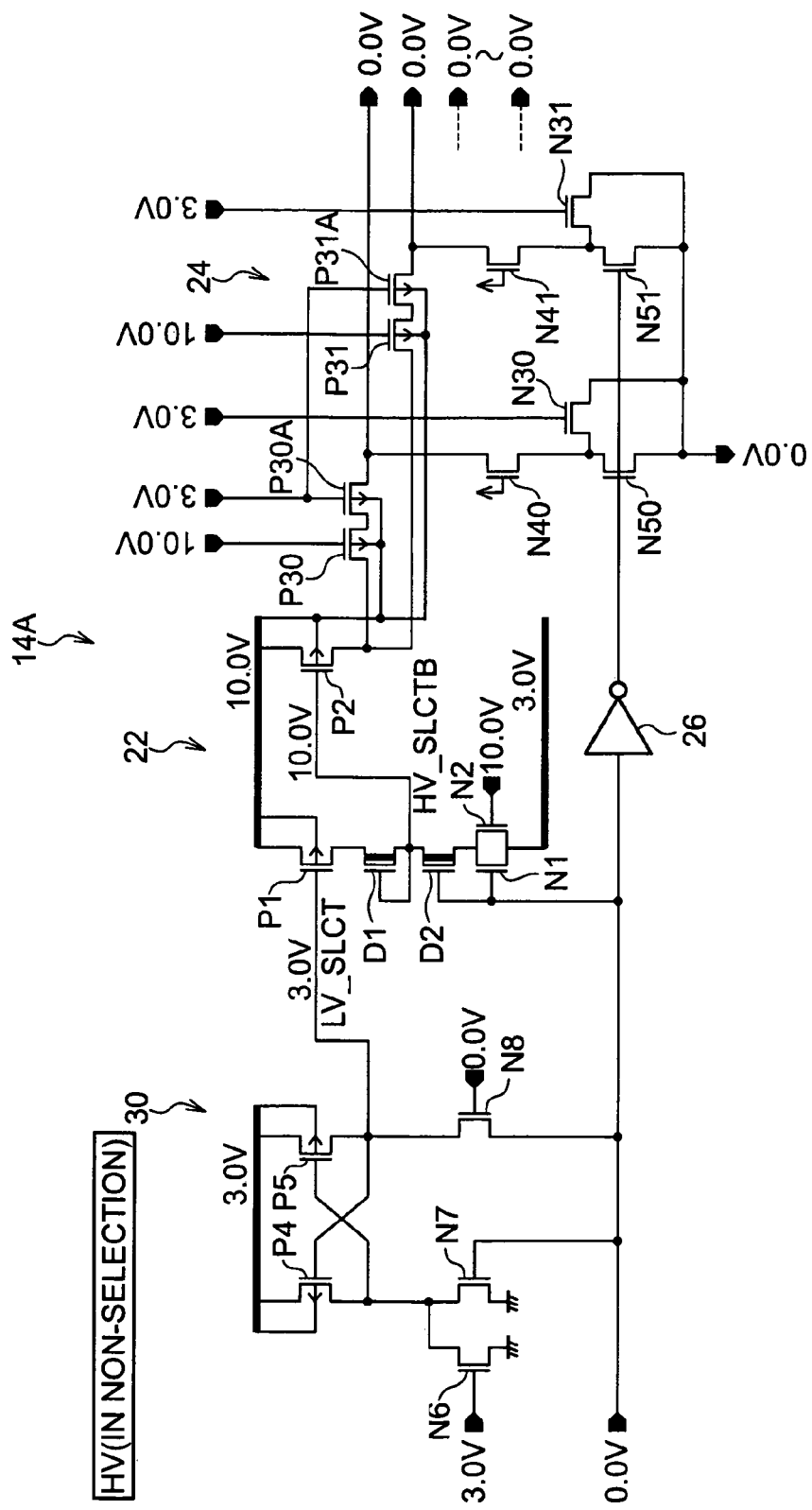
FIG. 9 is a diagram illustrating the voltage at the portions of the row decoder when no word line is selected in the high voltage operation, according to the second exemplary embodiment.

Next, an operation of the level shift circuit 30 will be described. The level shift circuit 30 operates as a level shift circuit which shifts the signal from VCC=3.0 [V] to VCW=3.6 [V] based on HVX="L" and HVXB="H". Accordingly, the level shift circuit 30 shifts SLCT="H"=VCC to LV_SLCT=VCW=3.6 [V] and outputs the shifted signal to the level shift circuit 22 at the rear stage thereof. The same description of the other operations as those of the first exemplary embodiment will be omitted In FIG. 8, the voltage states at the portions are shown when a word line is selected in the high voltage operation. In FIG. 9, the voltage states at the portions are shown when no word line is selected in the high voltage operation.

The row decoder 14 according to the second exemplary embodiment includes the level shift circuit 22 that shifts the voltage range, so that the voltage applied to the electrodes of the PMOS transistor P30 and the like of the word line selection circuit 24 is in the range from 0.0 [V] to VCC, in the normal operation, and is not in the range from 0.0 [V] to VPP but in the range from VCC to VPP, in the high voltage operation. Accordingly, the row decoder 14 according to the second exemplary embodiment of the present invention is not necessary to use a high-voltage PMOS transistor for the PMOS transistor P30 and the like of the word line selection circuit 24. Accordingly, in the row decoder 14 according to this exemplary embodiment may prevent an increase in the area of a circuit, and may maintain a high operation speed.

Third Exemplary Embodiment

Next, a third exemplary embodiment of the present invention will be described.

Figure 10:
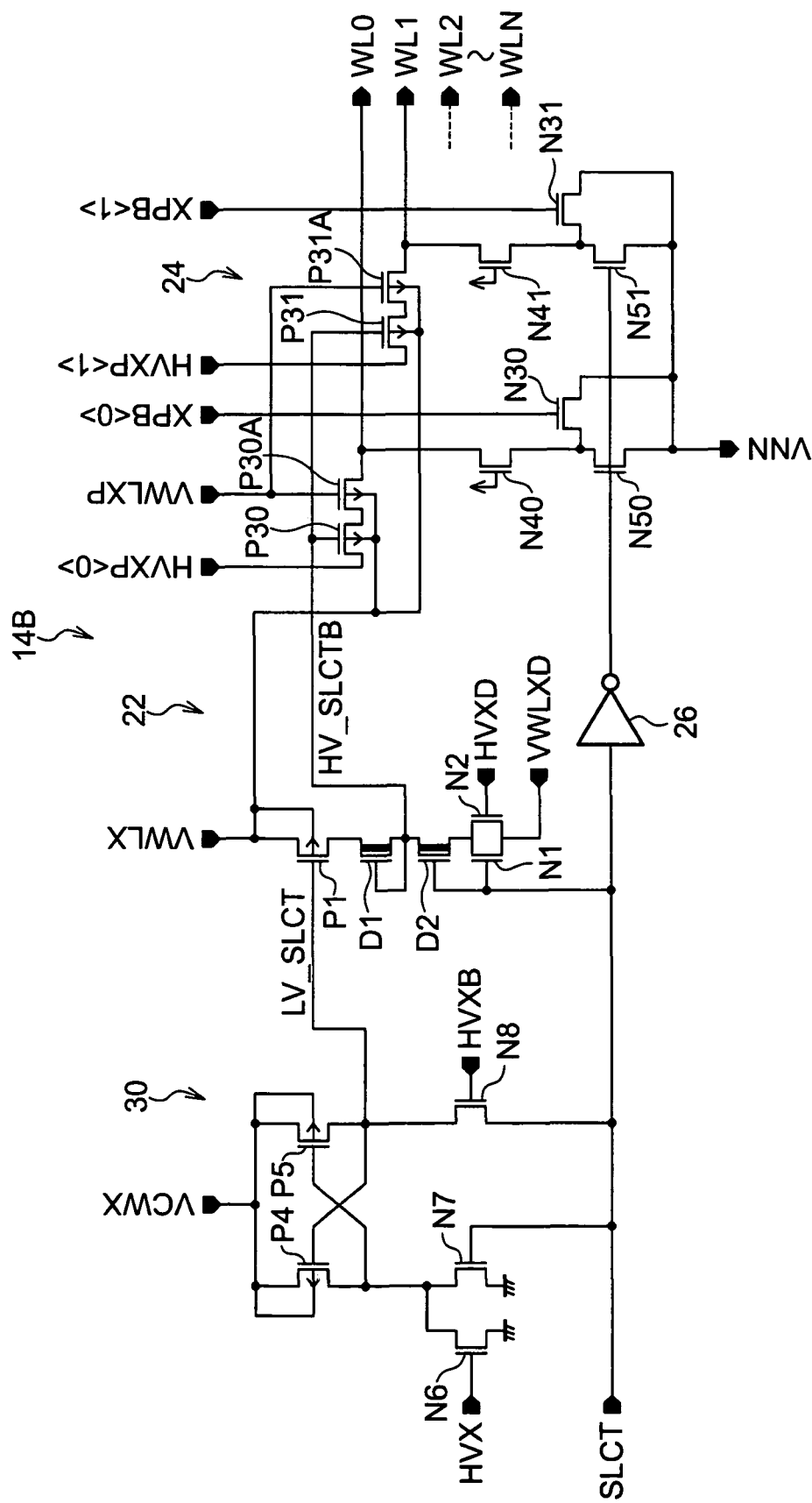
FIG. 10 is a circuit diagram illustrating a row decoder according to a third exemplary embodiment.

FIG. 10 is a circuit diagram illustrating a row decoder 14B according to the third exemplary embodiment of the present invention. The row decoder 14B according to the third exemplary embodiment is different from the row decoder 14A, described with reference to FIG. 5 according to the second exemplary embodiment, in that the PMOS transistors P2 of the word line selection circuit 24 are not used, and HV_SLCTB and HVXP are input to the gates and the sources of the PMOS transistors P30, P31, . . . , P3n, respectively. Note that the level shift circuits 30 and 22 are the same of those of the row decoder 14A according to the second exemplary embodiment.

In FIG. 11, the voltage values of the respective signals in normal operation (NORMAL) that uses a normal voltage when reading data, and in high voltage operation (HV) that uses a high voltage, for example, when writing or erasing data, in selection and non-selection of the word lines, are shown.

First, an operation for selecting a word line in the normal operation will be described.

In the selection operation in the normal operation, the controller 18 outputs HVX="L", HVXB="H", VCWX=VCW=3.6 [V] to the level shift circuit 30. Further, the controller 18 outputs HVXD=0.0 [V], VWLXD=0.0 [V] and VWLX=VCW=3.6 [V] to the level shift circuit 22. The controller 18 outputs VWLXP=0.0 [V] and VNN=0.0 [V] to the word line selection circuit 24. Note that, "H"=VCC=3.0 [V] and "L"=0.0 [V]. The voltage value of SLCT and LV_SLCT of the level shift circuit 30, the HV_SLCTB of the level shift circuit 22, and the signals HVXP [n:0] and XPB [n:0] of the word line selection circuit 24 are different from each other due to the selection of a word line WL.

Hereinafter, an operation for selecting the word line WL0 and supplying WL0=VCW=3.6 [V] will be described, as an example for selecting of a word line. In this case, the controller 18 outputs SLCT="H", HVXP [0]=VCW=3.6 [V], XPB [0]="L", HVXP [n:1]=0.0 [V], and XPB [n:1]="H" to each circuit. Note that, n is a positive integer, and HVXP [n:0] and XPB [n:0] correspond to n+1 lines of word lines WL.

An operation of the level shift circuit 30 will be described. The level shift circuit 30 operates as a level shift circuit which shifts the signal from VCC=3.0 [V] to VCW=3.6 [V] based on HVX="L" and HVXB="H". Accordingly, the level shift circuit 30 outputs the input SLCT="H"=VCC as LV_SLCT=VCW=3.6 [V] to the level shift circuit 22 at the rear stage thereof.

Next, an operation of the level shift circuit 22 will be described. The DMOS transistors D1 and D2 are always in a conductive state based on HVXD=0.0 [V], VWLXD=0.0 [V], and VWLX=VCW=3.6 [V], irrespective to the logical value of the signals SLCT and LV_SLCT. Therefore, the level shift circuit 22 operates as an inverter circuit configured by the PMOS transistor P1 and the NMOS transistor N1. Accordingly, the level shift circuit 22 outputs the input LV_SLCT=3.6 [V] as HV_SLCTB=0.0 [V] to the word line selection circuit 24.

Next, an operation of the word line selection circuit 24 will be described. All the NMOS transistors N50, N51, . . . , N5n in which the inverse logic of SLCT is input to the gate terminals become a non-conductive state based on SLCT="H". Here, since the word line WL0 is selected, HVXP [0] becomes VCW=3.6 [V], XPB [0] becomes "L", HVXP [n:1] become 0.0 [V], and XPB [n:1] become "H". The PMOS transistors P30 and P30A become a conductive state based on HV_SLCTB=0.0 [V], HVXP [0]=3.6 [V], and VWLXP=0.0 [V]. The NMOS transistors N30, N31, . . . , N3n become a non-conductive state based on XPB [0]="L". Thus, the word line WL0 is connected to HVXP [0]=VCW=3.6 [V] and is disconnected from VNN=0.0 [V]. Accordingly, WL0 becomes VCW=3.6 [V]. The other word lines WL are disconnected from HVXP [n:1] and are connected to VNN based on HVXP [n:1]=0.0 [V], VWLXP=0.0 [V], and XPB [n:1]="H". Accordingly, WL [n:1] become 0.0 [V].

When SLCT="H", HVXP [n:0]=VCW=3.6 [V], and XPB [n:0]="L", all the word lines WL [n:0] may be selected, as in the above-described case of the selection of the word line WL0. Accordingly, WL [n:0] become VCW=3.6 [V].

Next, an operation for selecting none of the word lines WL [n:0] will be described. In this case, the controller 18 outputs SLCT="L". For HVXP [n:0], VCW=3.6 [V] or VCW=0.0 [V] may be input, and for XPB [n:0] an arbitrary input value of "H" or "L" may be input.

By inputting SLCT="L", LV_SLCT=0.0 [V] becomes HV_SLCTB=3.6 [V]. Therefore, the PMOS transistors P30, P31, . . . , P3n become a non-conductive state. On the other hand, all the NMOS transistors N50, N51, ..., N5n, into which the inverse logic of the signal SLCT is input, become a conductive state. Thus, since the word lines WL [n:0] are disconnected from the signal HVXP [n:0] and are connected to the VNN, WL [n:0] become 0.0 [V].

Next, an operation for selecting a word line in the high voltage operation will be described.

In this operation, the controller 18 outputs HVX="H", HVXB="L", and VCWX=VCC=3.0 [V] to the level shift circuit 30. Further, the controller 18 outputs HVXD=VPP=10.0 [V], VWLXD=3.0 [V], and VWLX=VPP=10.0 [V] to the level shift circuit 22. Furthermore, the controller 18 outputs VWLXP=3.0 [V] and VNN=0.0 [V] to the word line selection circuit 24. Note that, "H"=VCC=3.0 [V] and "L"=0.0 [V]. Further, in the voltage value, SLCT of the level shift circuit 30, the signal HV_SLCTB of the level shift circuit 22, and the signals HVXP [n:0] and XPB [n:0] of the word line selection circuit 24 are different from each other, depending on the selection of a word line WL.

Hereinafter, an operation for selecting the word line WL0 and supplying WL0=VPP=10.0 [V] will be described as an example for selecting a word line. In this case, the controller 18 outputs SLCT="H", HVXP [0]=VPP=10.0 [V], XPB [0]="L", HVXP [n:1]=VCC=3.0 [V], and XPB [n:1]="H" to each circuit. Note that, n is a positive integer, and HVXP [n:0] and XPB [n:0] correspond to n+1 lines of word lines WL.

An operation of the level shift circuit 30 will be described. LV_SLCT output from the level shift circuit 22 is fixed to LV_SLCT=VCC=3.0 [V] based on HVX="H" and HVXB="L".

Next, an operation of the level shift circuit 22 will be described. Irrespective to the logical value of SLCT, the PMOS transistor P1 and the NMOS transistor N2 are always in a conductive state, based on LV_SLCT=3.0 [V], HVXD=VPP=10.0 [V], VWLXD=3.0 [V], and VWLX=VPP=10.0 [V]. When the gate voltage of the DMOS transistor D2 is equal to "H"=3.0 [V] based on SLCT="H", the DMOS transistor D2 is connected to the signal VWLXD, and the voltage of the signal HV_SLCTB is lowered. When the voltage of the signal HV_SLCTB is lowered, the driving force of the DMOS transistor D1 connected to the signal HV_SLCTB is further lowered. At this time, in order to lower the voltage of the signal HV_SLCTB to near VWLXD=3.0 [V], the driving force of the DMOS transistor D1 is adjusted to be considerably lower than the driving force of the DMOS transistor D2.

On the contrary, when no word line is selected, SLCT="L" is input. When the gate voltage of the DMOS transistor D2 is "L"=0.0 [V], the DMOS transistor D2 becomes a non-conductive state based on a source voltage=VWLXD=3.0 [V].

On the other hand, since the DMOS transistor D1 maintains the conductive state, the signal HV_SLCTB increases up to VWLX=10.0 [V]. Thus, the level shift circuit 22 operates as a level shifter, configured by the DMOS transistors D1 and D2, that shifts the voltage range of VCC=3.0 [V]/0.0 [V] to the voltage range of VPP=10.0 [V]/VCC=3.0 [V], and as an inverter circuit. Here, SLCT="H"=3.0 [V] is output as HV_SLCTB=3.0 [V] to the word line selection circuit 24.

Next, an operation of the word line selection circuit 24 will be described. All the NMOS transistors N50, N51, ..., N5n, in which the inverse logic of the signal SLCT is input to the gate terminal, become a non-conductive state based on SLCT="H". Here, since the word line WL0 is selected, the controller 18 outputs HVXP [0]=VPP=10.0 [V], XPB [0]="L", HVXP [n:1]=VCC=3.0 [V], and XPB [n:1]="H" to the word line selection circuit 24. The PMOS transistors P30 and P30A become a conductive state based on relations of HV_SLCTB=3.0 [V], HVXP [0]=10.0 [V], and VWLXP=3.0 [V]. The NMOS transistors N30, N31, ..., and N3n become a non-conductive state based on XPB[0]="L". Thus, the word line WL0 is connected to HVXP [0]=VPP=10.0 [V] and is disconnected from VNN=0.0 [V]. Therefore, WL0 becomes VPP=10.0 [V]. The other word lines WL1 to WLn are disconnected from HVXP [n:1] based on HVXP [n:1]=VCC=3.0 [V], VWLXP=3.0 [V], and XPB [n:1]="H" and are connected to the signal VNN. Therefore, WL [n:1] become 0.0 [V].

When SLCT="H", HVXP [n:0]=VPP=10.0 [V], and XPB [n:0]="L", all the word lines WL [n:0] may be selected, as in the above-described case of the selection of the word line WL0. Accordingly, WL [n:0] become VPP=10.0 [V].

Next, an operation for selecting none of the word lines WL [n:0] will be described. In this case, the controller 18 outputs SLCT="L". For HVXP [n:0], VPP=10.0 [V] or VCC=3.0 [V] may be input, and for XPB [n:0] an arbitrary input value of "H" or "L" may be input.

By inputting SLCT="L", HV_SLCTB becomes 10.0 [V]. Therefore, the PMOS transistors P30, P31, ..., P3n become a non-conductive state. On the other hand, all the NMOS transistors N50, N51, ..., N5n, into which the inverse logic of SLCT is input, become a conductive state. Thus, the word lines WL [n:0] are disconnected from HVXP [n:0] and are connected to the signal. VNN. Accordingly, WL [n:0] become 0.0 [V].

In the third exemplary embodiment, the PMOS transistor P2 of the row decoder 14A shown in FIG. 5 is not used. Accordingly, in the row decoder 14B according to the third exemplary embodiment, the number of transistors may be reduced and a circuit operation may be performed at a high speed.

Fourth Exemplary Embodiment

Next, a fourth exemplary embodiment of the present invention will be described.

Figure 12:
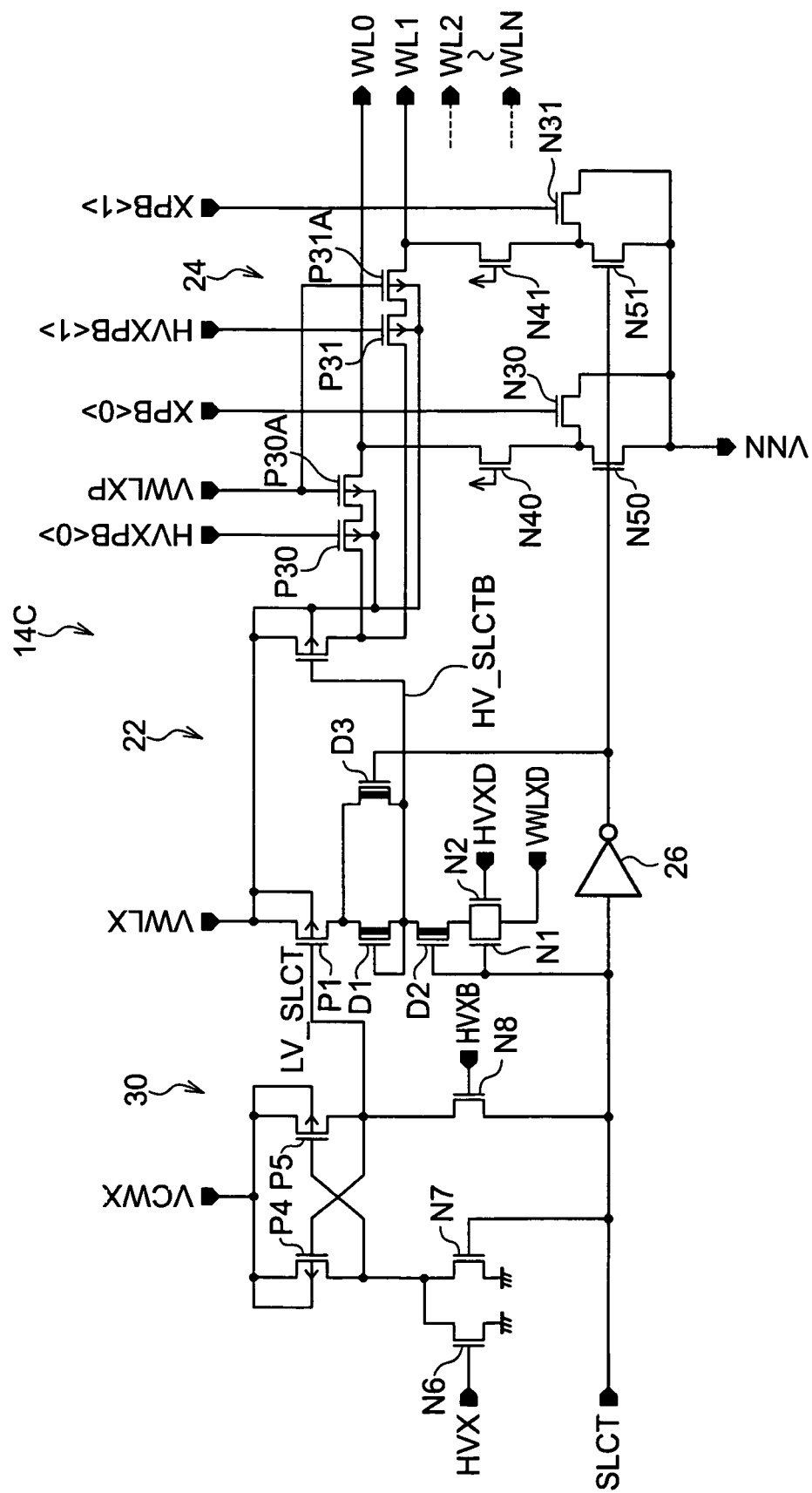
FIG. 12 is a circuit diagram illustrating a row decoder according to a fourth exemplary embodiment.

FIG. 12 is a circuit diagram illustrating a row decoder 14C according to the fourth exemplary embodiment of the present invention. The row decoder 14C according to the fourth exemplary embodiment is different from the row decoder 14A, described with reference to FIG. 5 according to the second exemplary embodiment, in that the DMOS transistor D3 is connected to the DMOS transistor D1 in parallel in the level shift circuit 22. A level shift circuit 30 and a word line selection circuit 24 are the same as those of the row decoder 14A.

First, an operation when SLCT changes from "H" to "L" while in the normal operation, will be described.

When in an equilibrium state, the voltage of HV_SLCTB becomes HV_SLCTB=0.0 [V] when SLCT is "H", and becomes HV_SLCTB=VCW=3.6 [V] when SLCT is "L". Accordingly, when SLCT changes from "H" to "L", the voltage of the HV_SLCTB increases from 0.0 [V] to 3.6 [V] with a time constant.

When SLCT changes from "H" to "L" in the row decoder 14A described in the second exemplary embodiment, the DMOS transistor D1 becomes a conductive state, and therefore, the voltage of the signal HV_SLCTB increases. However, in the fourth exemplary embodiment, since the gate terminal and the source terminal are connected to each other in the DMOS transistor D1, the voltage between the gate and source is always set to VGS=0.0 [V]. When SLCT is "H" in the selection operation of the word line while in the high voltage operation, the voltage of the signal HV_SLCTB is lowered to near VWLXD=3.0 [V]. Therefore, in the DMOS transistor D1, the driving force is adjusted to be considerably lowered when compared to the DMOS transistor D2. Due thereto, in the row decoder 14A according to the second exemplary embodiment, the time constant of the signal HV_SLCTB becomes larger relatively, when the voltage increases from 0.0 [V] to 3.6 [V].

On the other hand, in the row decoder 14C according to the fourth exemplary embodiment, the DMOS transistor D3 is added to the row decoder 14A and is connected to the DMOS transistor D1 in parallel: Therefore, when SLCT is "L", the gate terminal of the DMOS transistor D3 becomes "H". Accordingly, when the signal SLCT changes from "H" to "L" in the row decoder 14C, not only the DMOS transistor D1 but also the DMOS transistor D3 becomes a conductive state of VGS=3.0 [V]. When SLCT is "H" in the selection operation of a word line while in the high voltage operation, the DMOS transistor. D3 becomes a non-conductive state of VGS<−3.0 [V]. Therefore, in the fourth exemplary embodiment, the driving force of the DMOS transistor D3 is not required to be lowered than the driving force of the DMOS transistor D2. Thus, in the row decoder 14C according to the fourth exemplary embodiment, the transition of HV_SLCTB (from 0.0 [V] to 3.6 [V]) may be performed at a high speed in the selection operation of a word line in the normal operation.

What is claimed is:

1. A decoder circuit of a semiconductor storage device, comprising:
a word line selection circuit that includes voltage application MOS transistors corresponding to each of a plurality of word lines that apply a normal voltage in a predetermined normal operation to the word lines corresponding to memory cells selected among a plurality of memory cells positioned at a portion where the plurality of word lines intersect a plurality of bit lines, and that applies a high voltage higher than the normal voltage in a predetermined high voltage operation to the word lines; and
a level shift circuit that outputs to the voltage application MOS transistors at least one of the normal voltage and a ground voltage lower than the normal voltage according to a selection state of the word lines in the normal operation, and that outputs to the voltage application MOS transistor at least one of the normal voltage and the high voltage according to a selection state of the word lines in the high voltage operation,
wherein the voltage application MOS transistors of the word line selection circuit include PMOS transistors,
wherein the word line selection circuit includes a control PMOS transistor that controls output of a voltage applied to the voltage application MOS transistors, the control PMOS transistor including a source to which the normal voltage is input when the word line selection circuit performs the normal operation and to which the high voltage is input when the word line selection circuit performs the high voltage operation, and a drain connected to a source of each of the voltage application MOS transistors, and
wherein the level shift circuit includes
a PMOS transistor including a source to which the normal voltage is input in the normal operation and to which the high voltage is input in the high voltage operation, and a gate to which the normal voltage is input when the word line is selected in the normal operation, to which the ground voltage is input when the word line is not selected in the normal operation, and to which the normal voltage is constantly input in the high voltage operation,
a first DMOS transistor connected to the PMOS transistor in series, the first DMOS transistor including a gate and a source connected to a gate of the control PMOS transistor,
a second DMOS transistor connected to the first DMOS transistor in series and including a gate to which is input a selection signal that becomes active when the word line is selected,
a first NMOS transistor connected to the second DMOS transistor in series, the first NMOS transistor including a gate to which the selection signal is input, and
a second NMOS transistor connected to the first NMOS transistor in parallel and including a gate to which the ground voltage is input in the normal operation and to which the high voltage is input in the high voltage operation, and a source to which the ground voltage is input in the normal operation and to which the normal voltage is input in the high voltage operation.

2. A decoder circuit of a semiconductor storage device, comprising:
a word line selection circuit that includes voltage application MOS transistors corresponding to each of a plurality of word lines that apply a normal voltage in a predetermined normal operation to the word lines corresponding to memory cells selected from among a plurality of memory cells positioned at a portion where the plurality of word lines intersect a plurality of bit lines, and that applies a high voltage higher than the normal voltage in a predetermined high voltage operation to the word lines; and
a level shift circuit that outputs to the voltage application MOS transistors at least one of the normal voltage and a ground voltage lower than the normal voltage according to a selection state of the word lines in the normal operation, and that outputs to the voltage application MOS transistor at least one of the normal voltage and the high voltage according to a selection state of the word lines in the high voltage operation,
wherein the voltage application MOS transistors of the word line selection circuit include PMOS transistors including a source to which the normal voltage is input in the normal operation and to which the high voltage is input in the high voltage operation, and
wherein the level shift circuit includes
a PMOS transistor including a source to which the normal voltage is input in the normal operation and to which the high voltage is input in the high voltage operation, and a gate to which the normal voltage is input when the word line is selected in the normal operation, to which the ground voltage is input when the word line is not selected in the normal operation, and to which the normal voltage is constantly input in the high voltage operation,
a first DMOS transistor connected to the PMOS transistor in series, the first DMOS transistor including a gate and a source connected to a gate of the voltage application MOS transistor,
a second DMOS transistor connected to the first DMOS transistor in series, and including a gate to which is input a selection signal that becomes active when the word line is selected,
a first NMOS transistor connected to the second DMOS transistor in series, the first NMOS transistor including a gate to which the selection signal is input, and a second NMOS transistor connected to the first NMOS transistor in parallel, and including a gate to which the ground voltage is input in the normal operation and to which the high voltage is input in the high voltage operation, and a source to which the ground voltage is input in the normal operation and to which the normal voltage is input in the high voltage operation.

3. The decoder circuit of a semiconductor storage device of claim 1, further comprising a third DMOS transistor connected to the first DMOS transistor in parallel.

4. The decoder circuit of a semiconductor storage device of claim 3, further comprising a third DMOS transistor connected to the first DMOS transistor in parallel.

* * * * *